United States Patent
Shimatani et al.

(10) Patent No.: US 10,957,810 B2
(45) Date of Patent: Mar. 23, 2021

(54) ELECTROMAGNETIC WAVE DETECTOR, ELECTROMAGNETIC WAVE DETECTOR ARRAY, AND ELECTROMAGNETIC WAVE DETECTION METHOD

(71) Applicant: MITSUBISHI ELECTRIC CORPORATION, Chiyoda-ku (JP)

(72) Inventors: Masaaki Shimatani, Chiyoda-ku (JP); Shimpei Ogawa, Chiyoda-ku (JP); Daisuke Fujisawa, Chiyoda-ku (JP); Satoshi Okuda, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 57 days.

(21) Appl. No.: 16/475,432

(22) PCT Filed: Oct. 19, 2017

(86) PCT No.: PCT/JP2017/037813
§ 371 (c)(1),
(2) Date: Jul. 2, 2019

(87) PCT Pub. No.: WO2018/163496
PCT Pub. Date: Sep. 13, 2018

(65) Prior Publication Data
US 2019/0386167 A1    Dec. 19, 2019

(30) Foreign Application Priority Data
Mar. 10, 2017    (JP) .............................. JP2017-046476

(51) Int. Cl.
*H01L 31/11*    (2006.01)
*H01L 27/14*    (2006.01)
(Continued)

(52) U.S. Cl.
CPC ...... *H01L 31/1136* (2013.01); *H01L 27/1443* (2013.01); *H01L 27/1446* (2013.01);
(Continued)

(58) Field of Classification Search
CPC ............. H01L 31/1136; H01L 27/1443; H01L 27/1446; H01L 31/02019; H01L 31/02164;
(Continued)

(56) References Cited

U.S. PATENT DOCUMENTS 9,343,601 B2 *   5/2016   Choi ................. H01L 31/03921
2011/0042650 A1   2/2011   Avouris et al.
2018/0180573 A1 * 6/2018   Lin .................. H01L 29/78684

FOREIGN PATENT DOCUMENTS

| EP | 3 174 108 A1 | 5/2017 |
| JP | 1-302856 A | 12/1989 |
| JP | 2013-502735 A | 1/2013 |

OTHER PUBLICATIONS

Extended European Search Report dated Mar. 4, 2020, in Patent Application No. 17900074.0, citing documents AO and AX therein, 11 pages.
(Continued)

*Primary Examiner* — Seung C Sohn
(74) *Attorney, Agent, or Firm* — Xsensus LLP

(57) ABSTRACT

An electromagnetic wave detector comprises: p-type and n-type graphenes arranged side by side on an insulating layer; a first electrode and a second electrode opposing each other via the graphenes; a gate electrode for applying an operation voltage to the p-type and n-type graphenes; a balance circuit connected between two second electrodes; and a detection circuit. The p-type graphene has a Dirac point voltage higher than the operation voltage. The n-type graphene has a Dirac point voltage lower than the operation voltage. In a state in which no electromagnetic wave is
(Continued)

incident on the graphenes, the balance circuit places the first electrode and the second electrode at the same potential. In a state in which an electromagnetic wave is incident on the p-type and n-type graphenes, the detection circuit detects an electric signal between the second electrodes, and outputs an electric signal in the state in which the electromagnetic wave is incident.

18 Claims, 19 Drawing Sheets

(51) Int. Cl.
| | |
|---|---|
| *H01L 31/113* | (2006.01) |
| *H01L 27/144* | (2006.01) |
| *H01L 31/02* | (2006.01) |
| *H01L 31/0216* | (2014.01) |
| *H01L 31/0224* | (2006.01) |
| *H01L 31/028* | (2006.01) |
| *H01L 31/18* | (2006.01) |

(52) U.S. Cl.
CPC ...... *H01L 31/028* (2013.01); *H01L 31/02019* (2013.01); *H01L 31/02164* (2013.01); *H01L 31/022408* (2013.01); *H01L 31/1804* (2013.01)

(58) Field of Classification Search
CPC ........... H01L 31/022408; H01L 31/028; H01L 31/1804; H01L 31/113; H01L 31/0232; H01L 31/0288
See application file for complete search history.

(56) References Cited

OTHER PUBLICATIONS

Waal, D. J. D. et al., "An instrumentation amplifier based readout circuit for a dual element microbolometer infrared detector", Proceedings of SPIE/IS & T, XP060040729, vol. 9257, Jun. 23, 2004, 10 pages.

International Search Report dated Jan. 9, 2018 in PCT/JP2017/037813 filed on Oct. 19, 2017.

* cited by examiner

ELECTROMAGNETIC WAVE DETECTOR, ELECTROMAGNETIC WAVE DETECTOR ARRAY, AND ELECTROMAGNETIC WAVE DETECTION METHOD

TECHNICAL FIELD

The present invention relates to an electromagnetic wave detector, an electromagnetic wave detector array, and an electromagnetic wave detection method, and more particularly to an electromagnetic wave detector, an electromagnetic wave detector array, and an electromagnetic wave detection method using graphene as a detection layer.

BACKGROUND ART

In a conventional electromagnetic wave detector, a semiconductor material is generally used as an electromagnetic wave detection layer, but since the semiconductor material has a predetermined band gap, only an electromagnetic wave having energy larger than the band gap can be detected. On the other hand, graphene with a zero or extremely small band gap is noted as a material for an electromagnetic wave detection layer of a next generation electromagnetic wave detector. For example, an electromagnetic wave detector in which a gate oxide film is provided on a substrate, a graphene channel layer is deposited thereon, and a source and a drain are formed at both ends of the channel layer is proposed (see, for example, Patent Document 1).

PRIOR ART DOCUMENTS

Patent Documents

Patent Document 1: JP 2013-502735 A

SUMMARY OF THE INVENTION

Problems to be Solved by the Invention

However, when an electromagnetic wave detection layer is formed of graphene alone, absorptivity of an electromagnetic wave becomes as low as about several percentages. Even if a detectable wavelength band is expanded, there is a problem that detection sensitivity is lowered. Further, graphene has an ambipolar property, so unlike an ordinary semiconductor material, OFF operation is difficult. When the graphene is used as an electromagnetic wave detector, there is also a problem that a dark current cannot be set to zero.

Therefore, a purpose of the present invention is to provide an electromagnetic wave detector, an electromagnetic wave detector array, and an electromagnetic wave detection method using, as a material for an electromagnetic wave detection layer, graphene having a wide detectable wavelength band of an electromagnetic wave and high detection sensitivity, and capable of performing OFF operation.

Means for Solving the Problems

A first aspect of the present invention is
an electromagnetic wave detector for converting an electromagnetic wave into an electric signal and detecting the electric signal, including:
a substrate;
an insulating layer provided on the substrate;
p-type and n-type graphenes juxtaposed on the insulating layer;
a first electrode and a second electrode disposed facing each other with the p-type and n-type graphenes interposed,
the first electrode being one electrode electrically connected to both of the p-type and n-type graphenes at one ends,
the second electrode being two electrodes electrically connected to other ends of the p-type and n-type graphenes, respectively;
a gate electrode that applies an operation voltage to the p-type and n-type graphenes;
a balance circuit connected between the two second electrodes;
a detection circuit that detects electric signals between the two second electrodes,
wherein
the p-type graphene has a Dirac point voltage higher than the operation voltage, and the n-type graphene has a Dirac point voltage lower than the operation voltage,
in a state in which an electromagnetic wave is not incident on the p-type and n-type graphenes, the balance circuit makes the first electrode and the second electrode have an identical potential,
in a state in which the electromagnetic wave is incident on the p-type and n-type graphenes, the detection circuit detects electric signals between the second electrodes, and
the electric signals in the state in which the electromagnetic wave is incident are output.

Further, a second aspect of the present invention is
an electromagnetic wave detector converting an electromagnetic wave into an electric signal and detecting the electric signal, including:
a substrate;
an insulating layer provided on the substrate;
a graphene provided on the insulating layer;
a first electrode and a second electrode disposed facing each other with the graphene interposed, the first electrode electrically connected to one end of the graphene, and the second electrode electrically connected to another end of the graphene;
a gate electrode that applies a gate voltage to the graphene, the graphene becoming hole conductive when the gate voltage is $V_{OP1}$ and electron conductive when the gate voltage is $V_{OP2}$; and
a detection circuit that detects electric signals between the first electrode and the second electrode,
wherein
in a state in which an electromagnetic wave is not incident on the graphene, electric signals when the gate voltage is $V_{OP1}$ and $V_{OP2}$ are detected,
in a state in which the electromagnetic wave is incident on the graphene, electric signals when the gate voltage is $V_{OP1}$ and $V_{OP2}$ are detected, and
a difference in the electric signals when the gate voltage is $V_{OP1}$ and a difference in the electric signals when the gate voltage is $V_{OP2}$ between the state in which the electromagnetic wave is incident and the state in which the electromagnetic wave is not incident are obtained respectively, and a sum of these two differences are obtained and output.

Further, a third aspect of the present invention is
an electromagnetic wave detection method, in which a p-type transistor having a channel of a p-type graphene having a Dirac point voltage at a gate voltage higher than an operation gate voltage, and an n-type transistor having a channel of an n-type graphene having a Dirac point voltage at a gate voltage lower than the operation gate voltage are connected in series, and electric signals at both ends thereof are detected, including:

applying the operation gate voltage to the p-type transistor and the n-type transistor in a state in which an electromagnetic wave is not incident on the p-type graphene and the n-type graphene, and controlling a resistance value of the channel of the p-type graphene and a resistance value of the channel of the n-type graphene so as to become identical;

detecting the electric signals in the state in which the electromagnetic wave is not incident on the p-type graphene and the n-type graphene;

detecting the electric signals in a state in which the electromagnetic wave is incident on the p-type graphene and the n-type graphene; and obtaining and outputting a difference in the electric signals between the state in which the electromagnetic wave is incident and the state in which the electromagnetic wave is not incident.

Further, a fourth aspect of the present invention is an electromagnetic wave detection method for detecting electric signals at both ends of a transistor having a channel of graphene, in which the graphene becomes hole conductive when a gate voltage of the transistor is $V_{OP1}$ and becomes electron conductive when the gate voltage is $V_{OP2}$, comprising:

detecting the electric signals when the gate voltage is $V_{OP1}$ and $V_{OP2}$ in a state in which an electromagnetic wave is not incident on the graphene;

detecting the electric signals when the gate voltage is $V_{OP1}$ and $V_{OP2}$ in a state in which the electromagnetic wave is incident on the graphene; and obtaining a difference in the electric signals when the gate voltage is $V_{OP1}$ and a difference in the electric signals when the gate voltage is $V_{OP2}$ between the state in which the electromagnetic wave is incident and the state in which the electromagnetic wave is not incident, respectively, and obtaining and outputting a sum of these two differences.

Effects of the Invention

In the present invention, in an electromagnetic wave detector using graphene as an electromagnetic wave detection layer, it is possible to provide a high sensitivity electromagnetic wave detector in which a wavelength band of a detectable electromagnetic wave is wide, detection sensitivity is high, and OFF operation can be performed, and to provide a detection method using such an electromagnetic wave detector.

EMBODIMENTS OF THE INVENTION

In embodiments of the present invention, an electromagnetic wave detector will be described using visible light or infrared light, but in addition to these, the present invention is also effective as a detector of, for example, ultraviolet light, near infrared light, and a radio wave region such as a terahertz (THz) wave or a microwave. Note that, in the embodiments of the present invention, these light and radio waves are generically described as electromagnetic waves.

The embodiments of the present invention will be described using a structure having two electrodes of a source and a drain and a back gate electrode as an electromagnetic wave detector, but the present invention can be also applied to an electromagnetic wave detector provided with an electrode structure of four terminals, another electrode structure provided with a plurality of top gates and a back gate, or the like.

Although terms "p-type graphene" and "n-type graphene" are used as graphene in the embodiments of the present invention, intrinsic graphene which is not doped may be used. In addition, at the time of operation, the p-type graphene needs to have more holes than the n-type graphene, and the n-type graphene needs to have more electrons than the p-type graphene. So, the graphene does not need to be doped before the operation, and there is no limitation on a state of each majority carrier.

In the embodiments of the present invention, a material for a contact layer provided on the graphene is described using terms such as an n-type and a p-type. These terms indicate that one has an electron donating property if it is the n-type and that one has an electron withdrawing property if it is the p-type, for example. Further, deviation of charges is found in a whole molecule, and one in which electrons are dominant is called the n-type, and one in which holes are dominant is called the p-type. These include both organic and inorganic substances.

In addition, with regard to a surface plasmon resonance phenomenon or a plasmon resonance phenomenon that is an interaction between a metal surface and light, a phenomenon called a pseudo surface plasmon resonance meaning resonance applied to a metal surface other than a visible light range and a near infrared light range, or a phenomenon called a metamaterial or a plasmonic metamaterial meaning manipulation of a specific wavelength with a structure of a dimension smaller than the wavelength, these are not particularly distinguished by names, and are treated as an equivalent from an aspect of effects exerted by the phenomena. Here, these resonances are called surface plasmon resonance, plasmon resonance, or simply resonance.

Moreover, in each embodiment shown below, the same reference symbol denotes the same or corresponding portion, and detailed description of the portion is omitted by attaching the same reference symbol.

First Embodiment

Figure 1A:
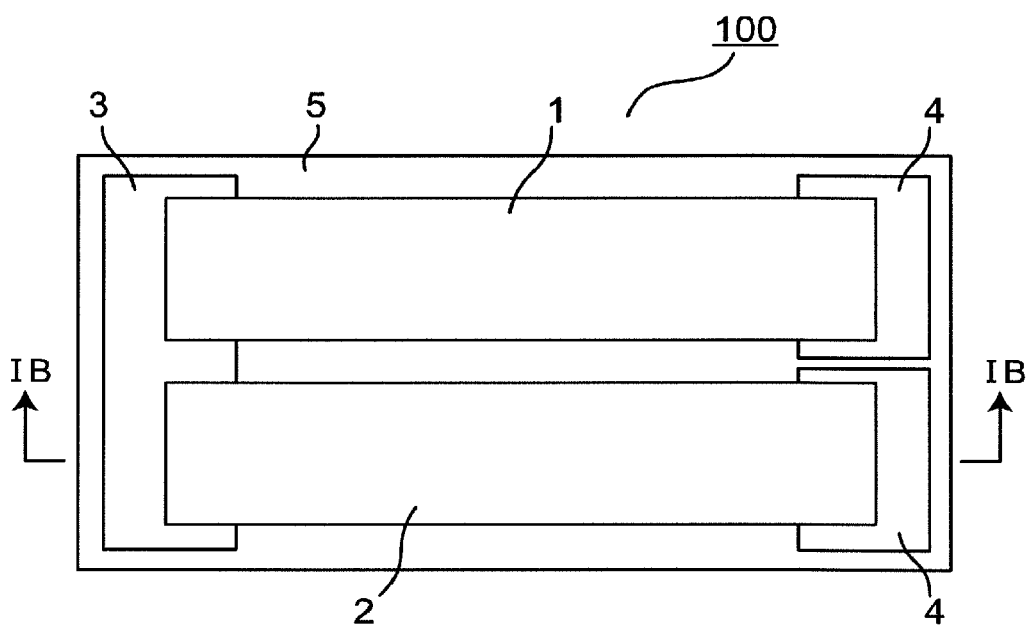
FIG. 1A is a top view of an electromagnetic wave detector according to a first embodiment of the present invention.
Figure 1B:
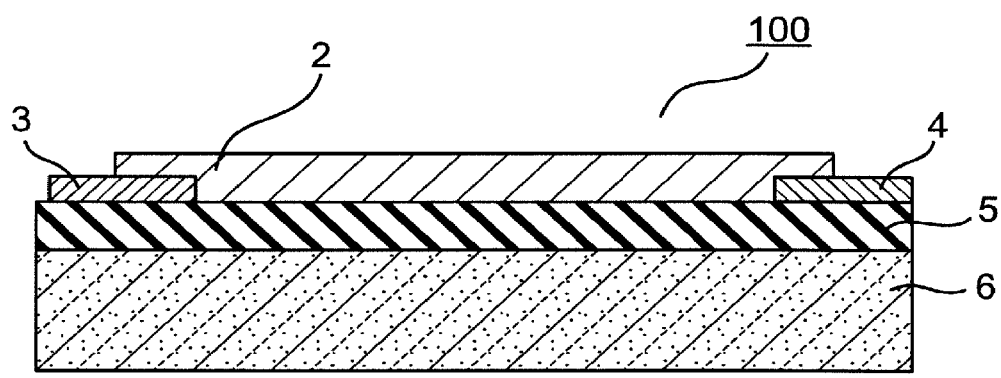
FIG. 1B is a sectional view of the electromagnetic wave detector of FIG. 1A as viewed in a IB-IB direction.
Figure 1C:
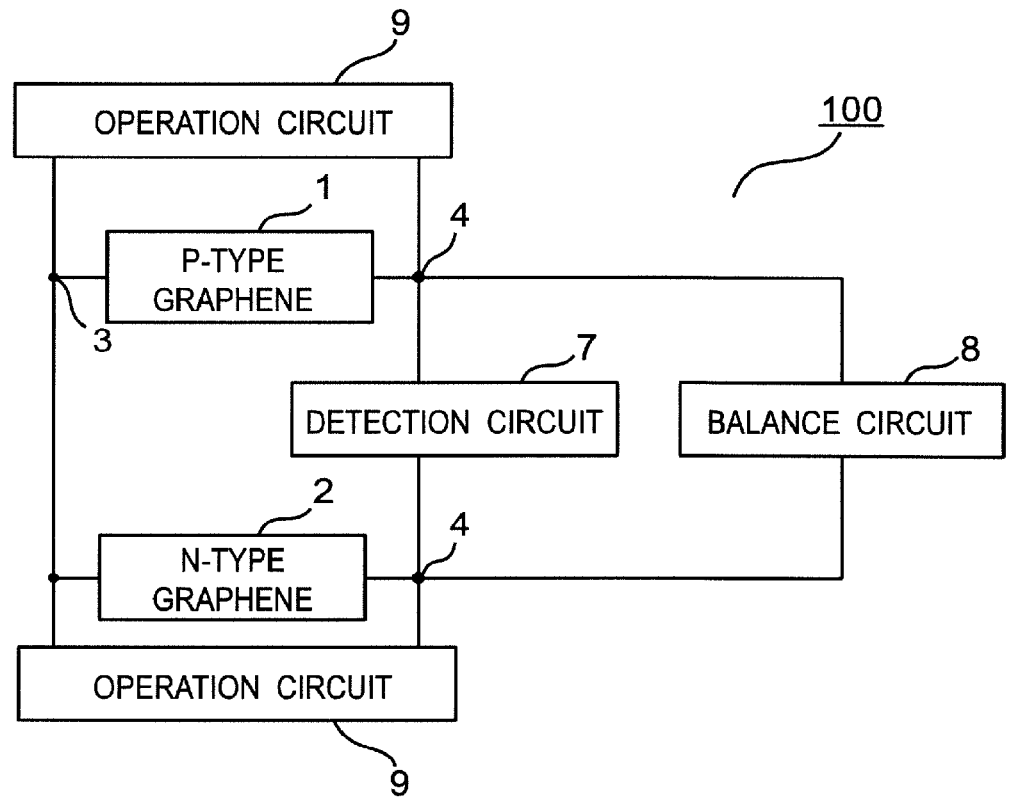
FIG. 1C is a circuit diagram of the electromagnetic wave detector according to the first embodiment of the present invention.

FIG. 1A is a top view of an electromagnetic wave detector according to a first embodiment of the present invention, which is generally represented by 100, and FIG. 1B is a sectional view of the electromagnetic wave detector 100 of FIG. 1A as viewed in a 1B-1B direction. Further, FIG. 1C is a circuit diagram of the electromagnetic wave detector 100 according to the first embodiment of the present invention.

As shown in FIGS. 1A and 1B, the electromagnetic wave detector 100 includes a substrate 6. The substrate 6 holds the entire electromagnetic wave detector 100, and is made of a semiconductor material such as silicon. For example, a high resistance silicon substrate or a substrate having a thermal oxide film formed thereon to enhance insulation is used. Alternatively, as described later, in a case where the substrate 6 is used as a back gate, a doped silicon substrate may be used.

An insulating layer 5 made of, for example, silicon oxide ($SiO_2$), silicon nitride (SiN), aluminum oxide, nickel oxide, or boron nitride (BN) is provided on the substrate 6. The boron nitride is preferable as a base film of graphene without disturbing performance of the graphene such as electron mobility because an atomic arrangement thereof is similar to a structure of the graphene and therefore charge transfer in the graphene is not impeded even if it contacts the graphene. Note that when the substrate 6 is a substrate having a thermal oxide film on a surface, the thermal oxide film may also serve as the insulating layer 5.

A p-type graphene 1 and an n-type graphene 2 are juxtaposed on an insulating layer 5. The p-type graphene 1 and the n-type graphene 2 are formed of a single layer or two or more layers of graphene. When the number of laminated graphene layers is increased, a light absorptivity increases, and detection sensitivity of the electromagnetic wave detector 100 increases. Note that the graphene is a monoatomic layer of a two-dimensional carbon crystal, and a thickness of single-layer graphene is as thin as 0.34 nm which is equivalent to one carbon atom. The graphene has carbon atoms in each chain arranged in a hexagonal shape.

In a case where the p-type graphene 1 and the n-type graphene 2 are formed of a laminated structure of two or more layers of graphene, in any two layers of graphene included in the laminated structure, directions of lattice vectors of hexagonal lattices do not have to match, that is, the directions of the lattice vectors may be deviated. In addition, a laminated structure in which lattice vectors coincide completely may be used. In particular, when two or more layers of graphene are laminated, a band gap is formed, thus, it is possible to have a wavelength selection effect.

Further, in a case of using nanoribbon-like graphene, a structure in which a graphene nanoribbon alone or a plurality of graphene nanoribbons is arranged may be used. The p-type graphene 1 and the n-type graphene 2 may be non-doped before operation, and may be p-type or n-type doped.

In addition, on surfaces of the p-type graphene 1 and the n-type graphene 2, one-dimensional or two-dimensional periodic recesses or protrusions may be provided. When the periodic recesses or protrusions are provided, an electromagnetic wave of a specific wavelength corresponding to a periodic structure can be absorbed. Since graphene is metalloid, absorption occurs by plasmon resonance similar to metal in principle. The recess may be a hole that penetrates the graphene. When the graphene is formed of a single layer, the recess is a hole penetrating the graphene. In a case where the graphene is formed of a plurality of layers, the recess does not penetrate the graphene if it is a hole that penetrates only any of the layers. In addition, in a case of a hole that penetrates all of the plurality of layers, the recess penetrates the graphene.

When the recesses are two-dimensionally arranged, a periodic arrangement may be any periodic arrangement such as a square lattice or a triangular lattice. Moreover, a shape of the recess when seen from the top may be any shape, such as a cylinder, a prism, a triangular prism, a quadrangular prism, or an elliptic cylinder. However, if the shape of the recess viewed from the top has asymmetry, such as the triangular prism, an ellipse, or a rectangle, light absorbed by the graphene has polarization dependence, so that an electromagnetic wave detector that detects only specific polarized light can be formed. On the other hand, when the recesses are one-dimensionally arranged, the periodic arrangement may be, for example, one-dimensional grooves arranged in parallel.

As described above, when the shape of the recess has the asymmetry such as the ellipse or the rectangle, or when the arrangement of the recesses has the asymmetry such as the one-dimensional periodic arrangement, polarization dependence occurs in light detection. It is also applicable to polarization imaging. In the polarization imaging, it is possible to distinguish a boundary between objects, artificial objects, and natural objects, etc. Conventionally, it is necessary to attach another part such as a polarizer or a polarization filter to an electromagnetic wave detector, so that there are problems such as an increase in size of the detector and system complexity. However, in the electromagnetic wave detector using graphene, a detector for detecting specific polarized light can be realized simply by processing the graphene into an asymmetric shape. Therefore, it is not necessary to separately provide the polarizer, the polarization filter, etc., and there are significant advantages such as miniaturization of a system, reduction in the number of parts, elimination of loss of light passing through the polarizer and the filter.

By forming such a periodic structure on the graphene, only an electromagnetic wave having a specific resonance wavelength can be absorbed by the surface of the graphene. In other words, in the electromagnetic wave detector 100, only the electromagnetic wave having the specific resonance wavelength can be strongly detected, and detection sensitivity of the specific wavelength can be enhanced.

Here, although the case where the periodic recesses are formed on the surface of the graphene has been described, periodic protrusions may be formed.

On the insulating layer 5, an electrode 3 connecting the p-type graphene 1 and the n-type graphene 2 in series, and two electrodes 4 facing the electrode 3 with the p-type graphene 1 and the n-type graphene 2 interposed therebetween are provided. The electrodes 3 and the electrode 4 are connected to both ends of the p-type graphene 1 and the n-type graphene 2. The electrodes 3 and 4 are formed of, for example, a metal such as Au, Ag, Cu, Al, Ni, Cr, or Pd. An adhesion film (not shown) made of Cr or Ti may be formed between the electrodes 3 and 4 and the insulating layer 5 thereunder. Shapes of the electrodes 3 and 4 are not particularly limited as long as size and thickness thereof are large enough to output an electric signal. In addition, the electrode 3 (for example, a source electrode) and the electrode 4 (for example, a drain electrode) may be formed of different metals.

The graphene is doped by a difference in work function of metal and graphene depending on a type of metal in contact. Thereby, the Fermi level of the graphene moves, or contact resistance fluctuates. Therefore, when the electrodes 3 and 4 are formed of different metals, an energy gap is different between the source and the drain. Therefore, when irradiated with light, bias is generated between the electrodes 3 and 4 by generated carriers, a photocurrent is increased, and sensitivity can be improved. In the first embodiment of the present invention, for the sake of simplicity, a case where the pair of electrodes 3 and 4 is formed on the p-type graphene 1 and the n-type graphene 2 respectively and electrical resistance between them is detected has been described as an example. However, other structures such as a transistor structure may be applied.

Also, periodic recesses or protrusions may be provided on surfaces of the electrodes 3 and 4. When the periodic recesses or protrusions are provided, plasmon resonance occurs on the surfaces of the electrodes 3 and 4. The recesses are, for example, cylindrical recesses arranged at predetermined intervals in two dimensions. The arrangement may be any periodic arrangement such as a square lattice or a triangular lattice. Instead of the cylinder, a recess having another shape such as a prism, a triangular prism, a quadrangular prism, or an elliptic cylinder may be used. Further, the recesses may be one-dimensional grooves arranged in parallel. These recesses may or may not penetrate the electrodes 3 and 4, and a pattern may be designed to detect a target wavelength. Providing such periodic recesses on the surfaces of the electrodes 3 and 4 causes plasmon resonance strongly localized to a metal surface at a specific wavelength. A material for the electrodes 3 and 4 may be any metal as long as surface plasmon resonance occurs. For example, Au, Ag, Al or the like is used. Here, a case where the periodic recesses are formed on the surfaces of the electrodes 3 and 4 has been described, but the same effect can be obtained even if the periodic protrusions are formed.

Here, a resonance wavelength of the plasmon resonance is determined depending on the periodic structure and the size of the recess or protrusion. By forming such a periodic structure on the electrodes 3 and 4, only an electromagnetic wave having a specific resonance wavelength can be absorbed by the electrode surfaces. In other words, in the electromagnetic wave detector 100, only the electromagnetic wave having the specific resonance wavelength can be strongly detected, and detection sensitivity of the specific wavelength can be enhanced.

As shown in FIG. 1C, the electromagnetic wave detector 100 has a detection circuit 7, a balance circuit 8, and operation circuits 9 as peripheral circuits. The operation circuits 9 apply external bias to the p-type graphene 1 and the n-type graphene 2 via the electrodes 3 and 4. Further, between the two electrodes 4, the detection circuit 7 detects a difference potential between the p-type graphene 1 and the n-type graphene 2. The balance circuit 8 is provided to balance the p-type graphene 1 and the n-type graphene 2.

Figure 2A:
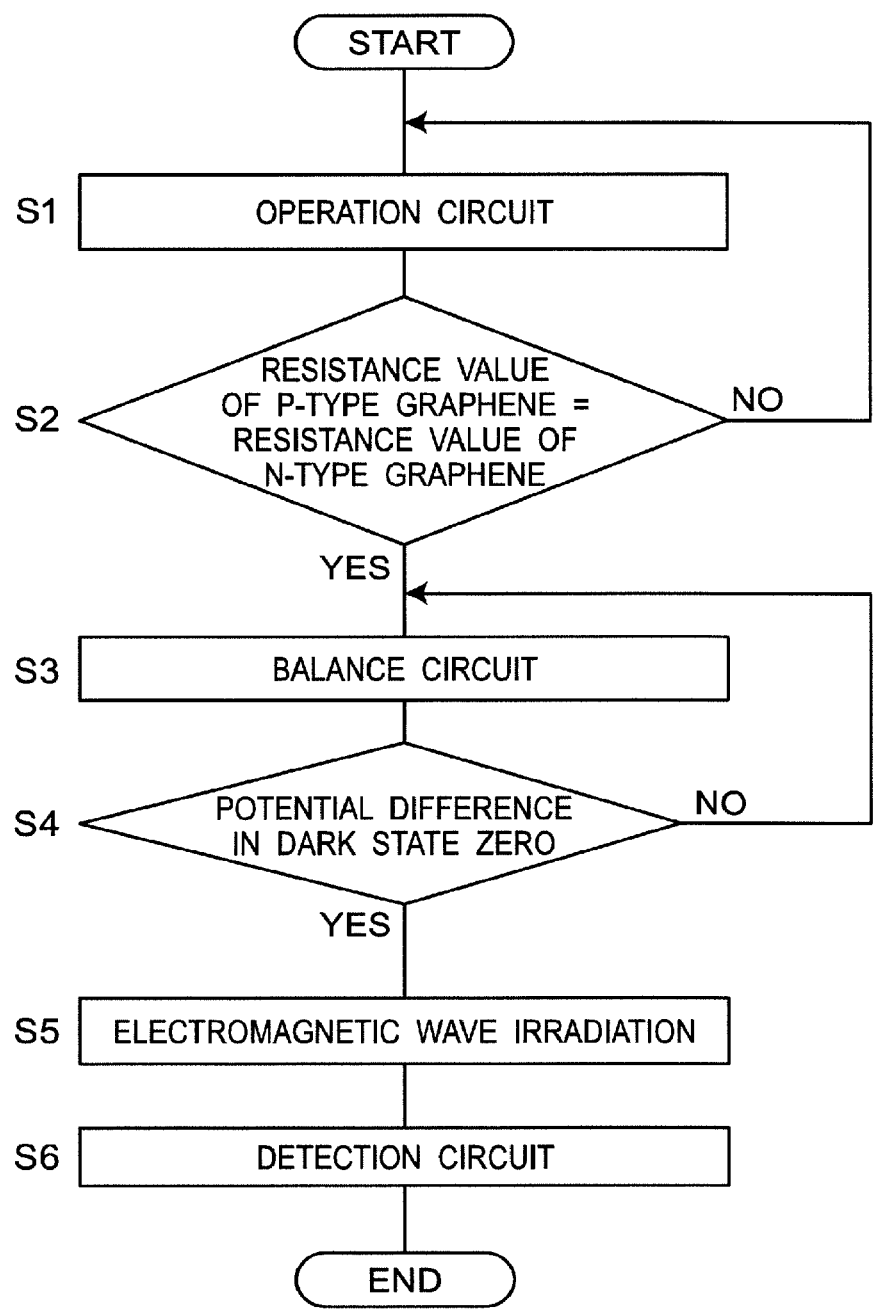
FIG. 2A is a flowchart of operation of the electromagnetic wave detector according to the first embodiment of the present invention.

Next, the operation of the electromagnetic wave detector 100 will be described with reference to FIG. 2A showing a flowchart of the operation of the electromagnetic wave detector 100.

First, a voltage $V_d$ is applied between the two electrodes 3 and 4 from the two operation circuits 9 shown in FIG. 1C (S1). As a result, resistance values inside the p-type graphene 1 and the n-type graphene 2 change, and an amount of current $I_d$ flowing between the electrodes 3 and 4 changes. The change in the amount of current $I_d$ is adjusted, and applied bias supplied to both ends of the p-type graphene 1 and the n-type graphene 2 from the respective operation circuits 9 is adjusted such that the resistance values of the p-type graphene 1 and the n-type graphene 2 become identical (the amounts of flowing current $I_d$ are identical) (S2). The applied bias may be a voltage or a current, as long as the resistance values of the p-type graphene 1 and the n-type graphene 2 become the same. Alternatively, the resistance value may be adjusted by applying a gate voltage with a back surface of the substrate 6 as a back gate terminal. In this case, by applying the voltage to the back surface of the substrate 6, a larger electric field can be generated in the p-type graphene 1, and carriers generated by incidence of an electromagnetic wave can be detected with high efficiency.

Figure 1D:
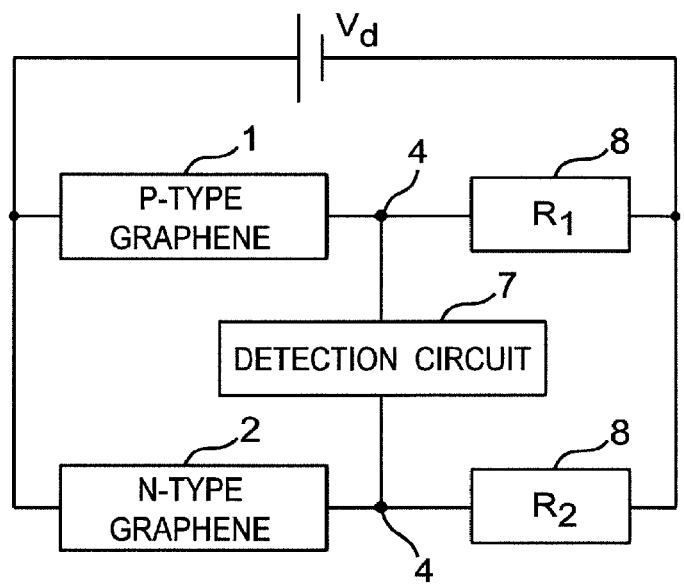
FIG. 1D is a circuit diagram of the electromagnetic wave detector according to the first embodiment of the present invention.

Next, using the balance circuit 8 (S3), resistance of the circuit is adjusted so that a potential difference in the dark state where the electromagnetic wave is not made incident becomes zero between terminals of the two electrodes 4 (S4). For example, as shown in FIG. 1D, the balance circuit 8 is configured of a bridge circuit or the like in which two resistance elements R1 and R2 are connected in order to balance the p-type graphene 1 and the n-type graphene 2. The resistance elements R1 and R2 are formed of a semiconductor thin film transistor element such as silicon, a thin film resistance element, a two-dimensional material transistor element, a transistor element using p-type graphene, a transistor element using n-type graphene, or the like. If the transistor elements using the p-type graphene 1 and the n-type graphene 2 are used as the resistance elements R1 and R2, it is possible to cancel time change and temperature change of the p-type graphene 1 and the n-type graphene 2 at the time of balance.

When the potential difference in the dark state is adjusted to be zero between the terminals of the two electrodes 4, the operation circuit 9 may be used to change and adjust the resistance of the p-type graphene 1 or the n-type graphene 2, or the operation circuit 9 may be set as a constant voltage and resistance values of the resistance elements R1 and R2 connected as the balance circuit 8 may be changed and adjusted. Further, both of the operation circuit 9 and the balance circuit 8 may be changed and adjusted. In this case, the adjustment of the operation circuit 9 and the balance circuit 8 may be performed in any order, as long as the potential difference between the terminals of the electrodes 4 becomes zero at a predetermined operation gate voltage in the dark state before electromagnetic wave irradiation. Further, a voltage in the dark state may be set to zero when an electric signal to be detected is output as a voltage, and a current in the dark state may be set to zero when output as a current.

For example, a voltmeter when detecting a voltage, or an ammeter when detecting a current may be used for the detection circuit 7. Further, a differential response can be further amplified and obtained by using a differential amplifier circuit such as an operational amplifier. Alternatively, an output amplifier circuit using graphene may be used as the amplifier circuit. As a result, the operation becomes faster as compared with the output amplifier circuit formed of a silicon-based semiconductor material, and a high performance electromagnetic wave detector can be realized. In addition, by using graphene for the peripheral circuits such as the detection circuit, high-speed readout and simplification of a manufacturing process are possible.

Figure 2B:
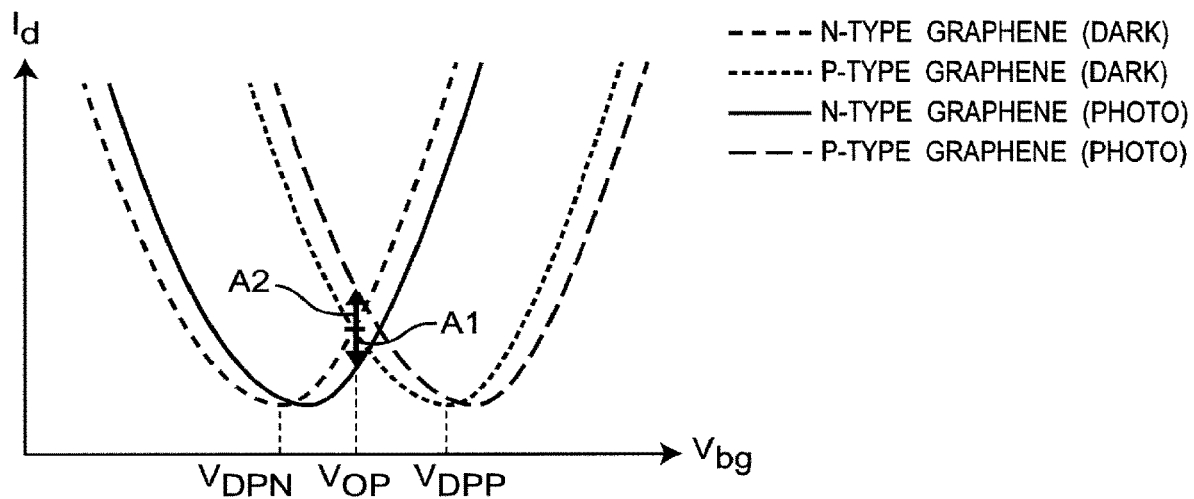
FIG. 2B is a graph showing an operation principle of the electromagnetic wave detector according to the first embodiment of the present invention.
Figure 2C:
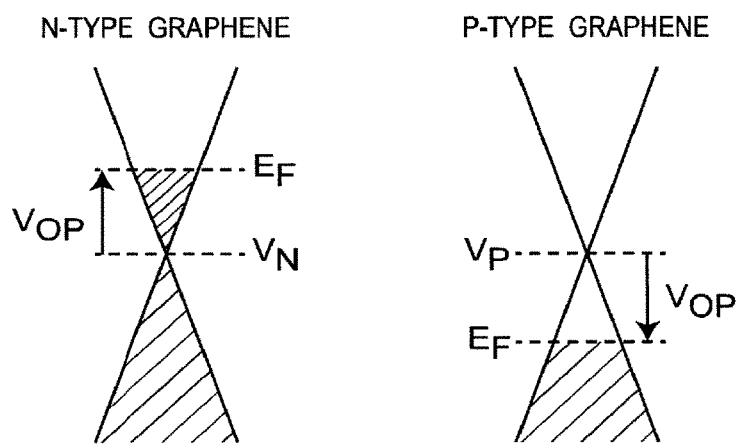
FIG. 2C is an energy band of p-type graphene and n-type graphene during operation of the electromagnetic wave detector according to the first embodiment of the present invention.

FIG. 2B is a graph showing an operation principle of an electromagnetic wave detector 100. FIG. 2C is an energy band of the p-type graphene and the n-type graphene at the time of operation of the electromagnetic wave detector 100. FIG. 2B shows a relationship between a back gate voltage Vbg and the current Id flowing through the graphene in a dark state (Dark) and at the time of electromagnetic wave irradiation (Photo) for each of the n-type graphene and the p-type graphene. As can be seen from FIG. 2B, an operation gate voltage Vop is set as a voltage smaller than a Dirac point voltage $V_{DPP}$ of the p-type graphene 1 and larger than a Dirac point voltage $V_{DPN}$ of the n-type graphene 2 in the dark state (Dark). For example, when the same voltage $V_d$ is applied between the electrodes 3 and 4 of the p-type grapheme 1 and the n-type graphene 2, the operation gate voltage $V_{OP}$ may be selected such that the resistance values of the p-type graphene 1 and the n-type graphene 2 are the same, that is, the current values Id of the n-type graphene (Dark) and the p-type graphene (Dark) are the same. At this time, as shown in FIG. 2C, the Fermi levels $E_F$ of the p-type graphene 1 and the n-type graphene 2 are shifted by the operation gate voltage $V_{OP}$.

Here, when the electromagnetic wave is irradiated in a state where the potential difference between the terminals of the two electrodes 4 is adjusted to zero in the dark state (S5), the Dirac point voltages of the p-type graphene 1 and the n-type graphene 2 are shifted to a plus side. As a result, for example, when the same bias voltage $V_d$ is applied to the p-type graphene 1 and the n-type graphene 2, as shown in FIG. 2B, the current $I_d$ in the p-type graphene 1 which is hole conductive decreases (arrow A1) at the operation gate voltage $V_{OP}$, and the current $I_d$ in the n-type graphene 2 which is electron conductive increases (arrow A2) at the operation gate voltage $V_{OP}$. As a result, when these differential currents are detected in the detection circuit 7 (S6), it is possible to obtain twice as many differential photocurrents with respect to a single element using only one of the p-type graphene 1 or the n-type graphene 2. Thus, detection sensitivity can be increased. Furthermore, when the temperature change or the time change occurs in the p-type graphene 1 and the n-type graphene 2, by outputting the difference, it is also possible to cancel these, and noise can be reduced. Note that, in the first embodiment, an example is described in which the Dirac point voltage is shifted to the plus side due to the electromagnetic wave irradiation, but the present invention is similarly applicable to a case where the Dirac point voltage is shifted to a minus side due to the electromagnetic wave irradiation.

Next, a method of manufacturing the electromagnetic wave detector 100 will be briefly described. The method of manufacturing the electromagnetic wave detector 100 includes the following steps 1 to 5.

Step 1: The flat substrate 6 made of silicon or the like is prepared.

Step 2: The insulating layer 5 is formed on the substrate 6. For example, when the substrate 6 is made of silicon, the insulating layer 5 may be made of thermally oxidized silicon oxide ($SiO_2$). In addition, another insulating layer may be formed by CVD or sputtering.

Step 3: The electrodes 3 and 4 made of a metal such as Au, Ag, Cu, Al, Ni, or Cr are formed. At this time, an adhesion film of Cr, Ti, or the like may be formed between the insulating layer 5 and the electrodes 3 and 4 in order to improve adhesion to the insulating layer 5 thereunder. The electrodes 3 and 4 are formed by forming a resist mask using photolithography or EB lithography, and then depositing a metal such as Au thereon by vapor deposition or sputtering. Thereafter, the electrodes 3 and 4 are formed by removing the resist mask. Generally, it is a method called lift-off.

Alternatively, a metal film may be formed first on the insulating layer 5, a resist mask may be formed by photolithography, and the electrodes 3 and 4 may be formed by wet etching or dry etching.

Step 4: Graphene is formed on the electrodes 3, 4 and the insulating layer 5. The graphene may be formed by epitaxial growth, or the graphene formed in advance using a CVD method may be transferred and attached. Alternatively, graphene separated by mechanical separation or the like may be transferred. Subsequently, a resist mask is formed over the graphene by photolithography or the like, and etching is performed by oxygen plasma to pattern the graphene. Thus, unnecessary portions of the graphene other than a channel portion and regions in contact with the electrodes 3 and 4 are removed to form the p-type graphene 1 and the n-type graphene 2 which are not doped.

Step 5: The top of the undoped p-type graphene 1 is covered with a resist mask by photolithography or the like. At that time, the undoped n-type graphene 2 not covered with the resist mask is doped into an n-type with a tetramethylammonium hydroxide solution used as a developer. After that, the resist mask on the undoped p-type graphene 1 may or may not be peeled off. The undoped p-type graphene 1 is doped into a p-type by the resist mask.

The electromagnetic wave detector 100 according to the first embodiment of the present invention is completed by the above steps 1 to 5. Although the graphene is formed on the electrodes 3 and 4 here, the graphene may be formed in advance on the insulating layer 5, and the electrodes 3 and 4 may be formed on the graphene. However, in a case of using this structure, care must be taken to prevent process damage to the graphene when the electrodes 3 and 4 are formed.

Note that the detection circuit 7, the balance circuit 8, and the operation circuits 9 are preferably formed on the substrate 6, but may be external circuits.

As described above, in the electromagnetic wave detector 100 according to the first embodiment of the present invention, by using two graphenes, the p-type graphene 1 and the n-type graphene 2, compared to a single element using only one of them, it becomes possible to obtain a doubled differential photocurrent, and an electromagnetic wave can be detected with high sensitivity. In addition, influence of the temperature change and the time change can be offset between the p-type graphene 1 and the n-type graphene 2, and detection noise can be reduced.

Second Embodiment

Figure 3A:
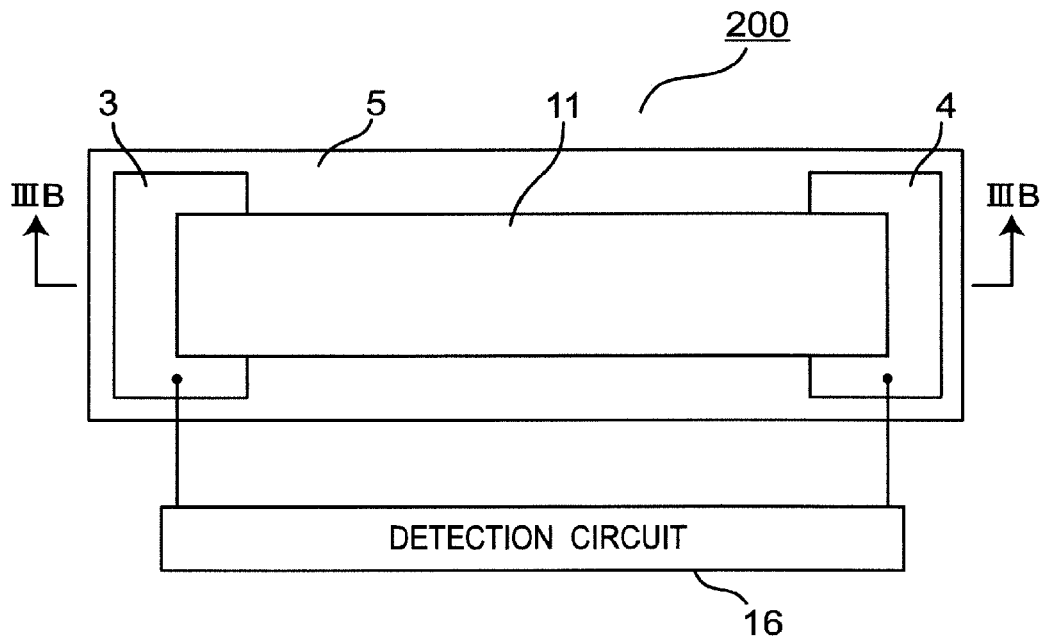
FIG. 3A is a top view of an electromagnetic wave detector according to a second embodiment of the present invention.
Figure 3B:
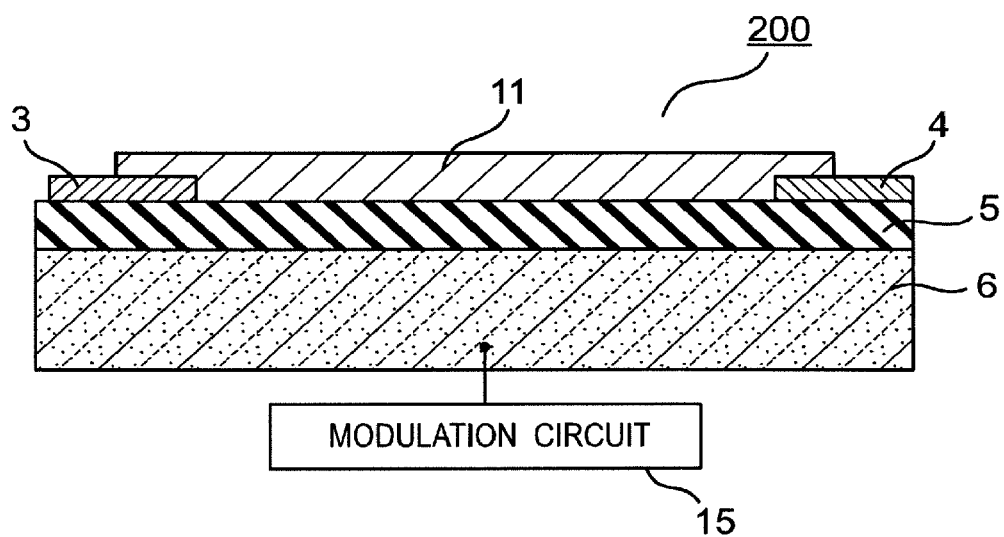
FIG. 3B is a sectional view of the electromagnetic wave detector of FIG. 3A as viewed in a IIIB-IIIB direction.

FIG. 3A is a top view of an electromagnetic wave detector according to a second embodiment of the present invention, which is generally indicated by 200, and FIG. 3B is a sectional view of the electromagnetic wave detector 200 of FIG. 3A as viewed in a IIIB-IIIB direction. In FIGS. 3A and 3B, the same reference symbols in FIGS. 1A and 1B indicate the same or corresponding portions.

In the electromagnetic wave detector 200, an insulating layer 5 is formed on a substrate 6, and a pair of electrodes 3 and 4 is provided on the insulating layer 5. A graphene 11 is provided on the insulating layer 5 so that both ends are connected to the electrodes 3 and 4, respectively. In addition, a modulation circuit 15 for temporally changing a gate voltage is connected to the substrate 6 which also serves as a gate electrode. Further, a detection circuit 16 for detecting a differential photocurrent is connected between the electrodes 3 and 4. The detection circuit 16 may be used as an operation circuit for applying a voltage.

The electromagnetic wave detector 200 according to the second embodiment differs from the electromagnetic wave detector 100 according to the first embodiment in that, while the electromagnetic wave detector 100 has two types of graphene 1 and 2 and detects the differential photocurrent thereof, in the electromagnetic wave detector 200, a difference in photoresponse during hole conduction and during electron conduction is detected by a graphene transistor provided with one type of graphene 11.

Figure 4A:
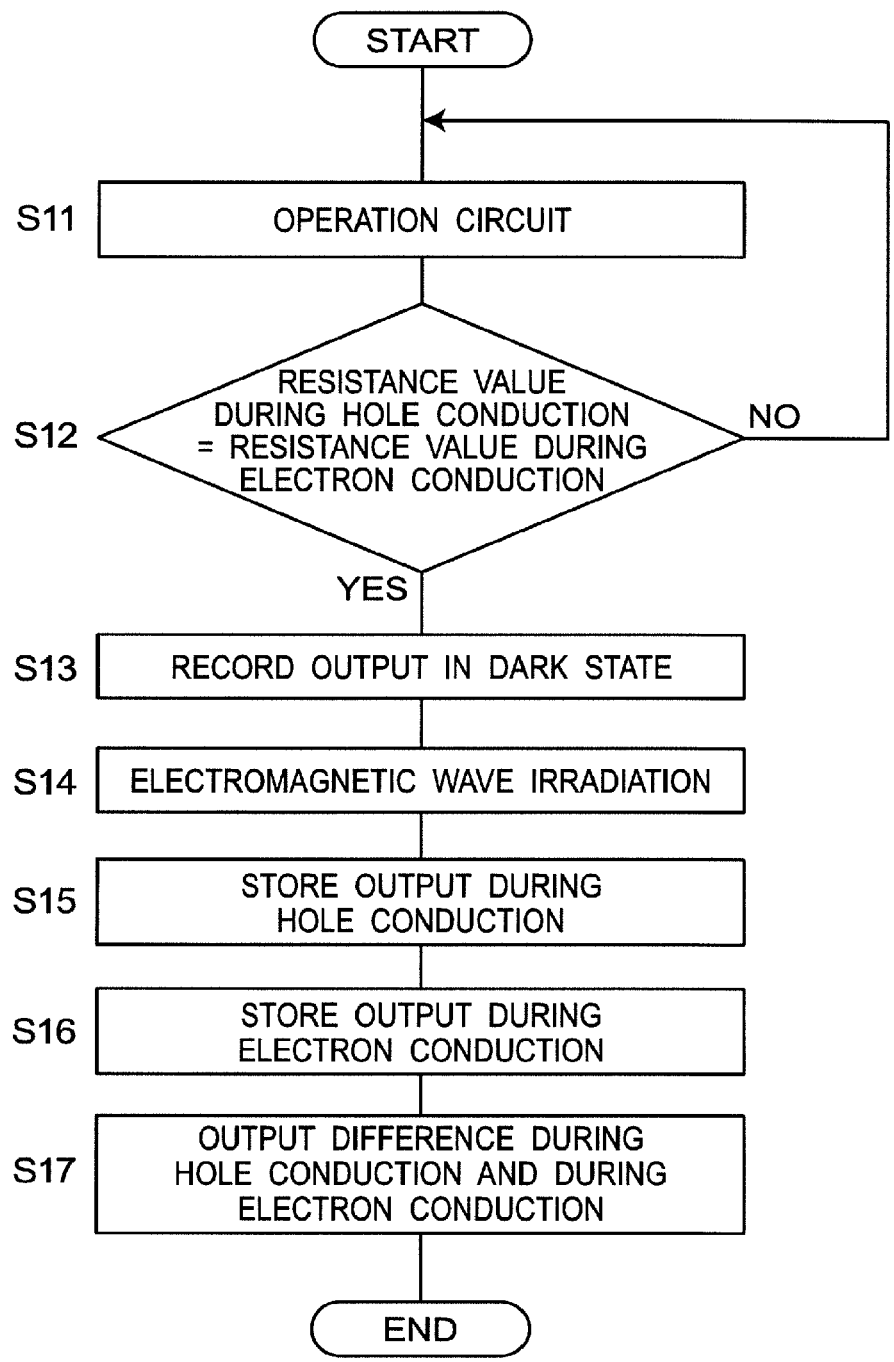
FIG. 4A is a flowchart of operation of the electromagnetic wave detector according to the second embodiment of the present invention.
Figure 4B:
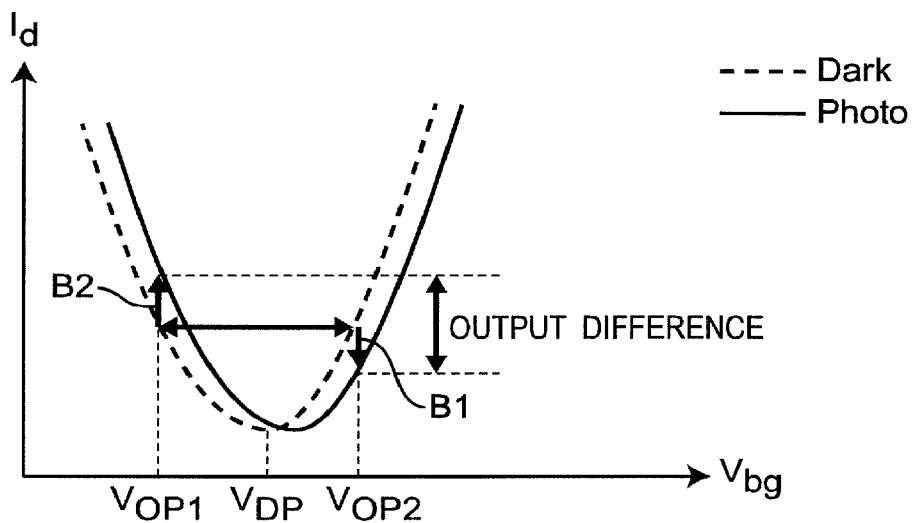
FIG. 4B is a graph showing an operation principle of the electromagnetic wave detector according to the second embodiment of the present invention.

FIG. 4A is an operation flowchart of the electromagnetic wave detector 200 according to the second embodiment of the present invention, and FIG. 4B is a diagram showing an operation principle of the electromagnetic wave detector 200.

In an operation method of the electromagnetic wave detector 200, first, in a dark state, a source/drain voltage Vd is applied between the electrodes 3 and 4 from the detection circuit 16 which also serves as the operation circuit. A gate voltage Vbg is applied to the substrate 6 from the modulation circuit 15 (S11). When the gate voltage is smaller than a Dirac point voltage $V_{DP}$, hole conduction in which holes become carriers is realized, and when the gate voltage is larger than the Dirac point voltage $V_{DP}$, electron conduction in which electrons become carriers is realized. Then, Vbg and Vd are adjusted so that resistance values of the graphene 11 at a gate voltage $V_{OP1}$ during hole conduction and a gate voltage $V_{OP2}$ during electron conduction become the same, that is, Id has the same value (S12). The output Id at this time is recorded using the detection circuit 16 (S13).

Next, when an electromagnetic wave is irradiated (S14), as shown in FIG. 4B, a current value at $V_{OP1}$ rises (arrow B2), and a current value at $V_{OP2}$ decreases (arrow B1). While recording each output Id at this time, each difference is calculated and recorded (S14, S15). Then, difference outputs in a bright state (Photo) are subtracted from the output Id in a dark state (Dark), thereby detecting as a response output (sum of differences: |B1|+|B2|) (S17). Note that, in the second embodiment, an example is described in which the Dirac point voltage is shifted to a plus side due to the electromagnetic wave irradiation, but the present invention is similarly applicable to a case where the Dirac point voltage is shifted to a minus side due to the electromagnetic wave irradiation.

In the second embodiment, the gate voltage is applied to the substrate 6 from a back gate, but may be applied from the top of the graphene 11 by forming a top gate. Further, in the second embodiment, although the method of detecting the electromagnetic wave response as the current is described, it may be detected as a voltage.

Figure 5:
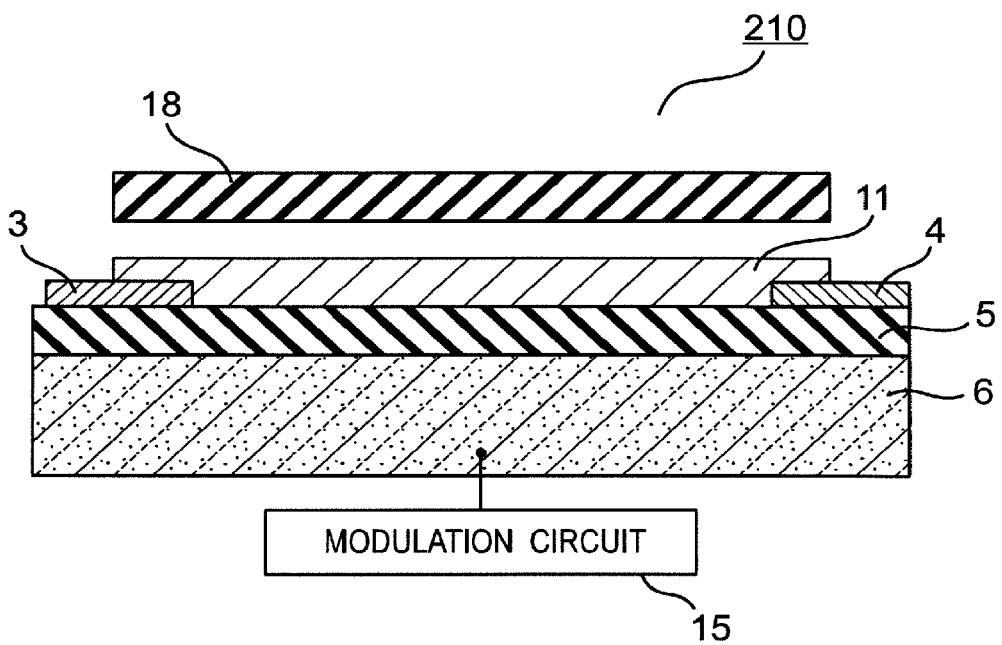
FIG. 5 is a sectional view of another electromagnetic wave detector according to the second embodiment of the present invention.
Figure 6:
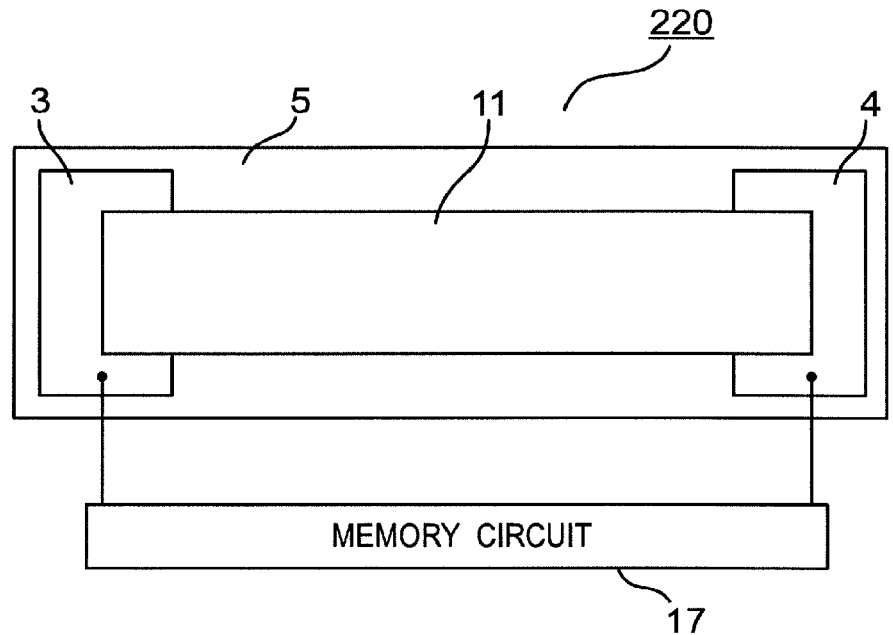
FIG. 6 is a top view of another electromagnetic wave detector according to the second embodiment of the present invention.

FIGS. 5 and 6 show a sectional view and a top view of other electromagnetic wave detectors 210, 220 according to the second embodiment of the present invention. For switching between a dark state and a bright state, a shutter mechanism 18 as shown in FIG. 5 may be used. The shutter mechanism 18 enables arbitrary switching of light and dark. Further, as shown in FIG. 6, a memory circuit 17 may be provided between terminals of electrodes 3 and 4 to store an output in each state.

As described above, the electromagnetic wave detector 200 according to the second embodiment of the present invention detects an electromagnetic wave with high sensitivity by measuring the outputs during the hole conduction and the electron conduction using the single graphene.

Third Embodiment

Figure 7A:
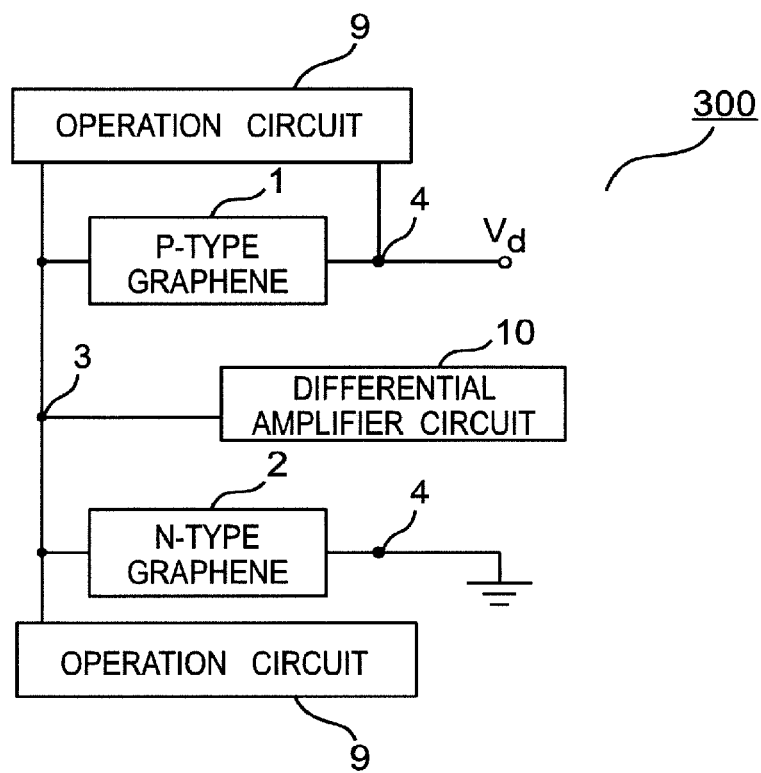
FIG. 7A is a circuit diagram of an electromagnetic wave detector according to a third embodiment of the present invention.
Figure 7B:
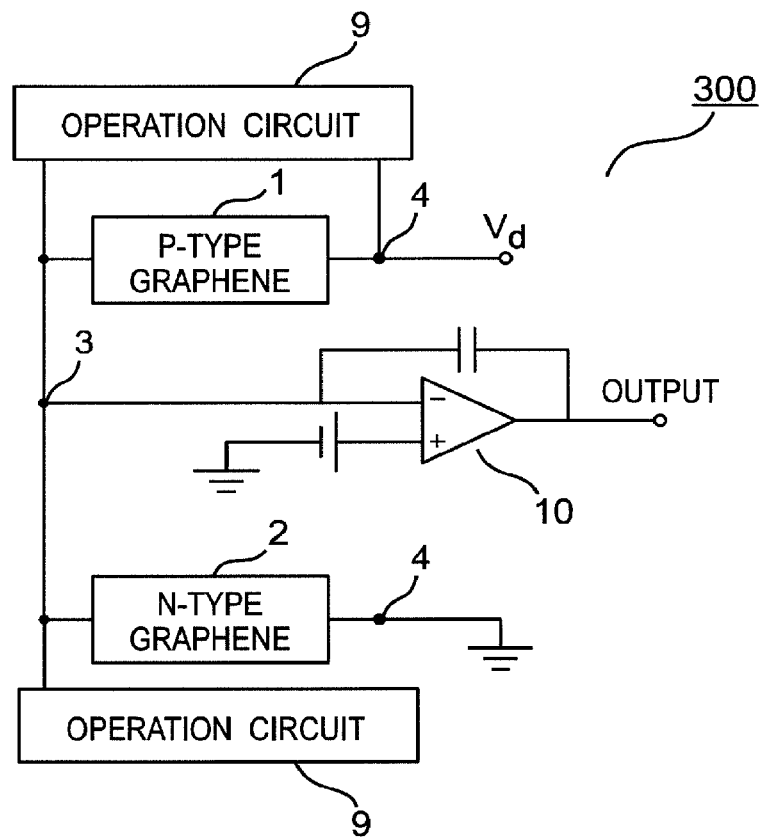
FIG. 7B is a differential amplifier circuit diagram of the electromagnetic wave detector according to the third embodiment of the present invention.

FIG. 7A is a circuit diagram of an electromagnetic wave detector according to a third embodiment of the present invention, which is generally represented by 300, and FIG. 7B is a circuit of the electromagnetic wave detector 300 according to the third embodiment of the present invention. In FIGS. 7A and 7B, the same reference symbols as in FIGS. 1C and 1D indicate the same or corresponding portions.

The electromagnetic wave detector 300 according to the third embodiment is different from the electromagnetic wave detector 100 according to the first embodiment in that, as shown in FIG. 7A, a differential amplifier circuit 10 is connected to an electrode 3 as a detection circuit. In the electromagnetic wave detector 100, it is necessary to balance the circuit using the balance circuit 8. However, in the electromagnetic wave detector 300, since a differential current flowing in a p-type graphene 1 and an n-type graphene 2 in a bright state is used as an input to the differential amplifier circuit 10, a balance circuit is not required, a single pixel is simplified, and miniaturization is enabled. Further, a configuration of the differential amplifier circuit 10 is not limited as long as the differential current flowing in the p-type graphene 1 and the n-type graphene 2 can be detected. For example, as shown in FIG. 7B, an integrating circuit using an operational amplifier may be used as the differential amplifier circuit 10. By using the operational amplifier, an average value of outputs can be obtained, and an S/N ratio is improved.

Fourth Embodiment

Figure 8A:
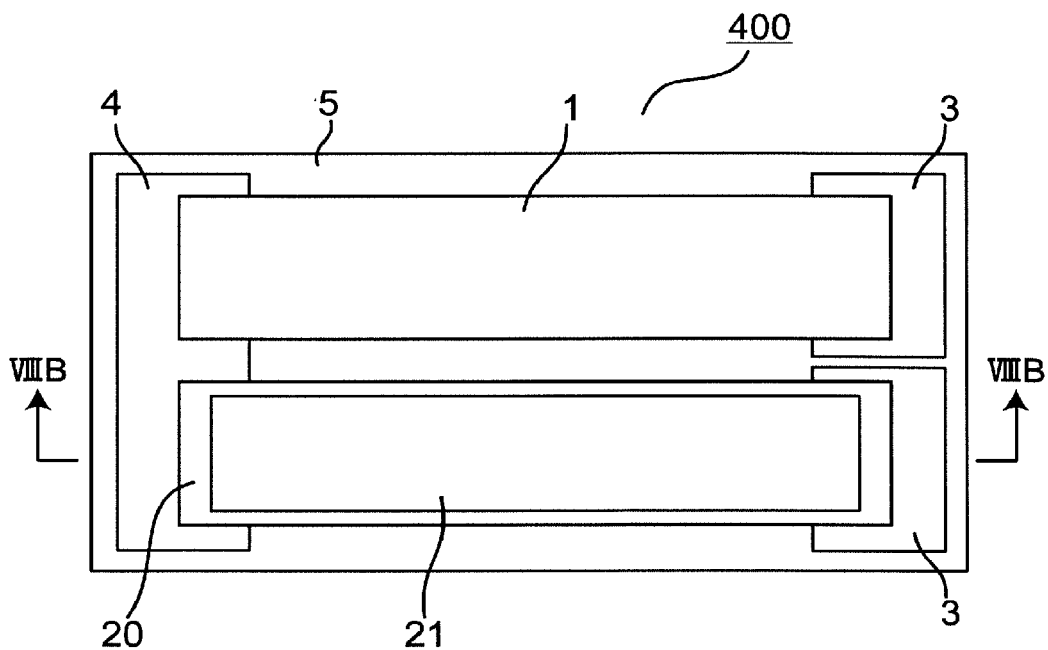
FIG. 8A is a top view of an electromagnetic wave detector according to a fourth embodiment of the present invention.
Figure 8B:
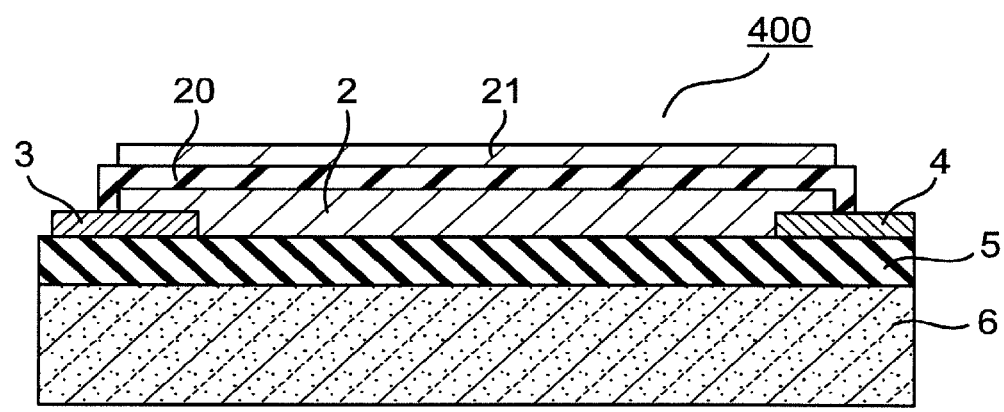
FIG. 8B is a sectional view of the electromagnetic wave detector in FIG. 8A as viewed in an VIIIB-VIIIB direction.
Figure 8C:
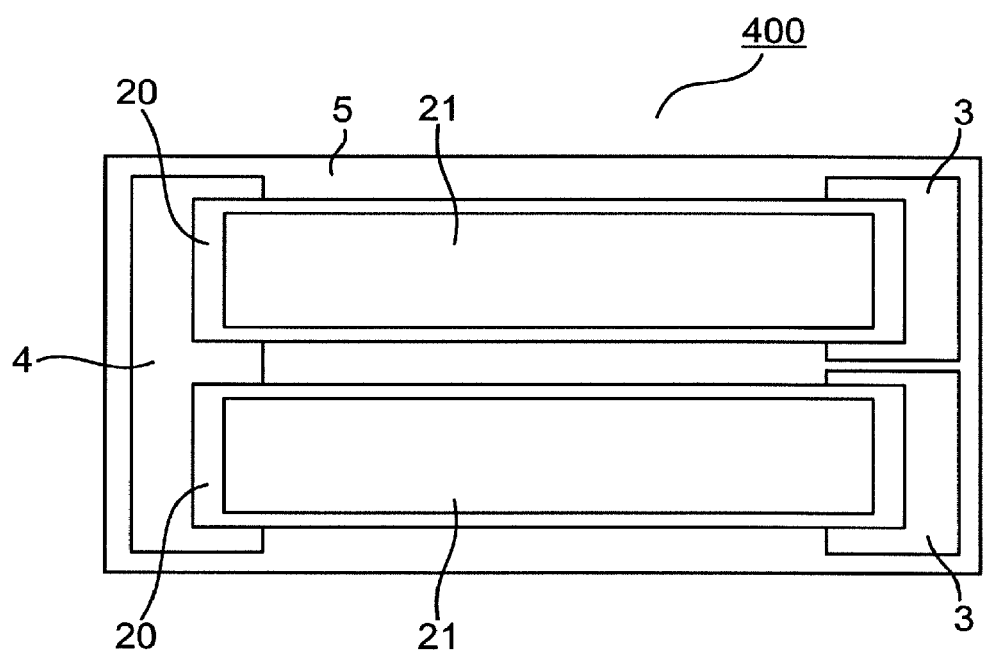
FIG. 8C is a top view of another electromagnetic wave detector according to the fourth embodiment of the present invention.

FIG. 8A is a top view of an electromagnetic wave detector according to a fourth embodiment of the present invention, generally indicated by 400, and FIG. 8B is a sectional view of the electromagnetic wave detector 400 of FIG. 8A as viewed in an VIIIB-VIIIB direction. Further, FIG. 8C is a top view of another electromagnetic wave detector according to the fourth embodiment of the present invention, which is generally denoted by 450. In FIGS. 8A, 8B, and 8C, the same reference symbols as in FIGS. 1A and 1B indicate the same or corresponding portions.

The electromagnetic wave detector 400 according to the fourth embodiment of the present invention differs from the electromagnetic wave detector 100 according to the first embodiment in that, as shown in FIGS. 8A and 8B, a top gate electrode 21 is formed on an n-type graphene 2 via an insulating layer 20. The insulating layer 20 and the top gate electrode 21 may alternatively be formed on a p-type graphene 1 or on both the p-type graphene 1 and the n-type graphene 2 as shown in FIG. 8C.

By providing such a top gate electrode 21, graphene can be doped from both a back gate and a top gate. Therefore, for example, even when Dirac point voltages of the p-type graphene 1 and the n-type graphene 2 are the same, by controlling either one of them by the back gate and controlling the other by the back gate and the top gate, it becomes possible to obtain any Dirac point voltage. As a result, chemical doping of the p-type graphene 1 and the n-type graphene 2 becomes unnecessary, the graphene can be selectively doped, and a drive range of the electromagnetic wave detector is expanded. Further, in a case of the chemical doping, although a temporal change may occur depending on a form of the electromagnetic wave detector, the electromagnetic wave detector 400 can eliminate a change in a doping level due to the temporal change.

In addition, by forming the insulating layer 20 so as to cover the p-type graphene 1 and the n-type graphene 2, a function as a protective film can also be obtained. By providing the protective film, it is possible to prevent a property of the graphene from being changed due to influence of a surrounding atmosphere. In particular, in the atmosphere, the graphene is affected by air molecules and moisture to change a Dirac point, so providing the protective film ensures stable operation of the graphene. Also, in a case where the electromagnetic wave detector is used in a high temperature or low temperature environment, it is equally important to stably hold the operation of graphene. For example, silicon oxide ($SiO_2$), aluminum oxide ($Al_2O_3$), silicon nitride (SiN), hafnium oxide ($HfO_2$), boron nitride, or the like can be used as the insulating layer 20 also serving as the protective film. As a material for the insulating layer 20 which also serves as the protective film, it is preferable to select a protection material through which an electromagnetic wave to be detected passes.

Fifth Embodiment

Figure 9A:
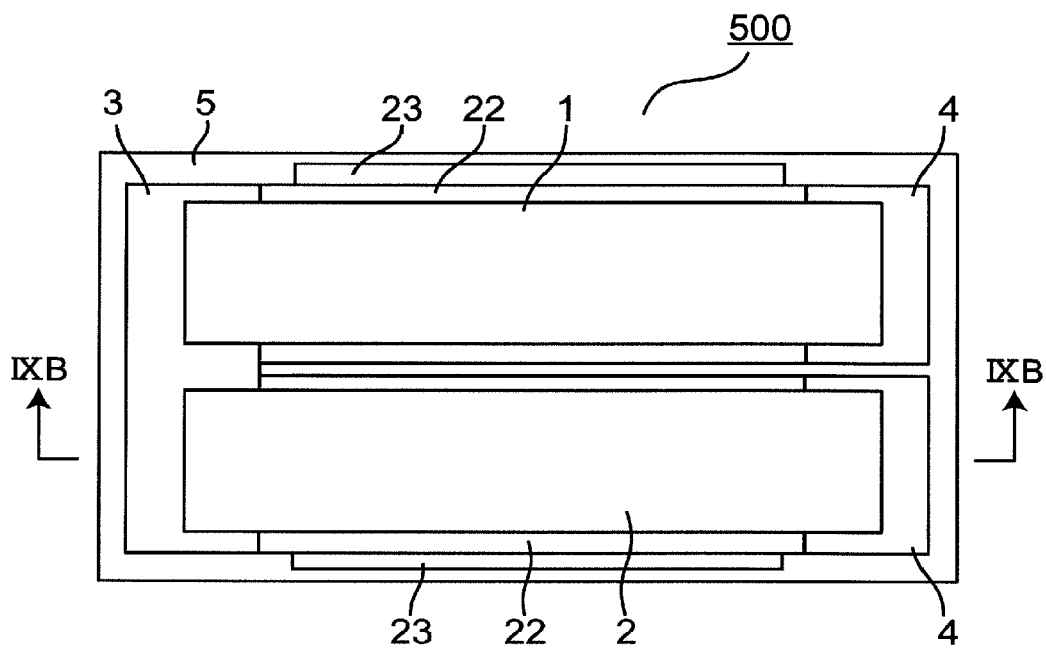
FIG. 9A is a top view of an electromagnetic wave detector according to a fifth embodiment of the present invention.
Figure 9B:
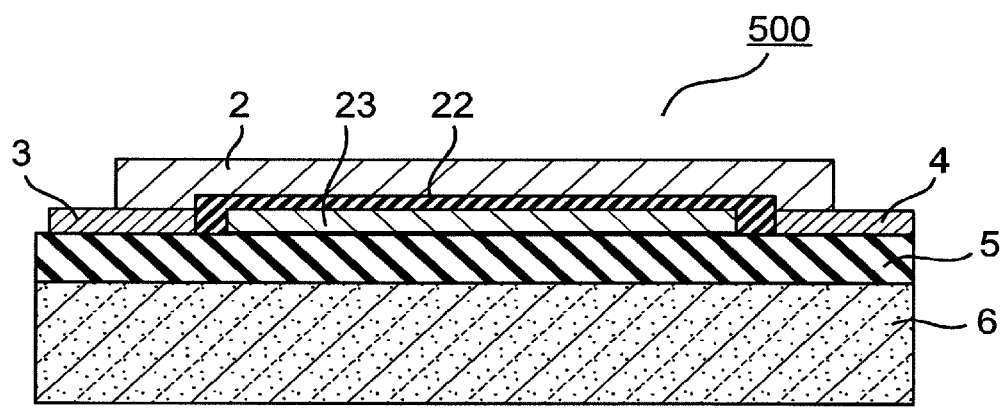
FIG. 9B is a sectional view of the electromagnetic wave detector in FIG. 9A as viewed in a IXB-IXB direction.

FIG. 9A is a top view of an electromagnetic wave detector according to a fifth embodiment of the present invention, which is generally represented by 500, and FIG. 9B is a sectional view of the electromagnetic wave detector 500 of FIG. 9A as viewed in a IXB-IXB direction. In FIGS. 9A and 9B, the same reference symbols as in FIGS. 1A and 1B indicate the same or corresponding portions.

The electromagnetic wave detector 500 according to the fifth embodiment of the present invention is different from the electromagnetic wave detector 100 according to the first embodiment in that, as shown in FIGS. 9A and 9B, in the electromagnetic wave detector 500, an insulating layer 22 and a back gate electrode 23 are formed between an insulating layer 5 and both of a p-type graphene 1 and an n-type graphene 2. Thus, graphene can be doped from two back gates of a back gate to which a voltage is applied from a substrate 6 and the back gate electrode 23. Therefore, for example, even when Dirac point voltages of the p-type graphene 1 and the n-type graphene 2 are the same, by controlling either one of them by the back gate applied from the substrate 6 and controlling the other by the back gate applied from the back gate electrode 23 on a surface side, it is possible to obtain any Dirac point voltage. As a result, chemical doping is not necessary, and the graphene can be selectively doped, so that a drive range of the electromagnetic wave detector is expanded. Further, in a case of the chemical doping, although a temporal change may occur depending on a form of the electromagnetic wave detector, the electromagnetic wave detector 500 can eliminate a change in a doping level due to the temporal change.

In particular, in the electromagnetic wave detector 500 according to the fifth embodiment, since the back gate electrode 23 is disposed under the p-type graphene 1 and the n-type graphene 2, the doping level of the graphene can be controlled without attenuating an electromagnetic wave incident on the p-type graphene 1 and the n-type graphene 2.

Note that, in FIG. 9A, although a case where the insulating layer 22 and the back gate electrode 23 are formed between the insulating layer 5 and both of the p-type graphene 1 and the n-type graphene 2 has been described, the insulating layer 22 and the back gate electrode 23 may be provided between the insulating layer 5 and one of the p-type graphene 1 and the n-type graphene 2.

Sixth Embodiment

Figure 10A:
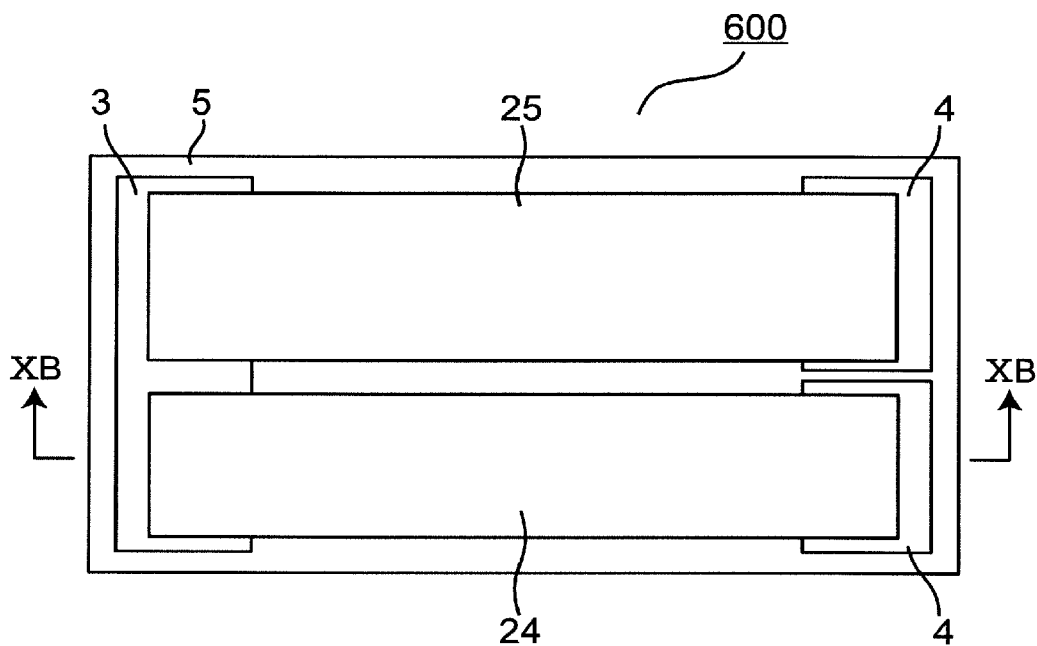
FIG. 10A is a top view of an electromagnetic wave detector according to a sixth embodiment of the present invention.
Figure 10B:
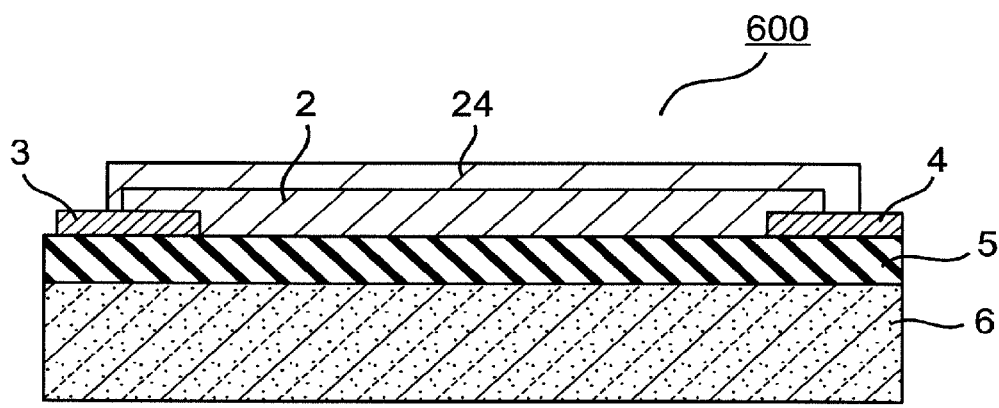
FIG. 10B is a sectional view of the electromagnetic wave detector in FIG. 10A as viewed in a XB-XB direction.
Figure 10C:
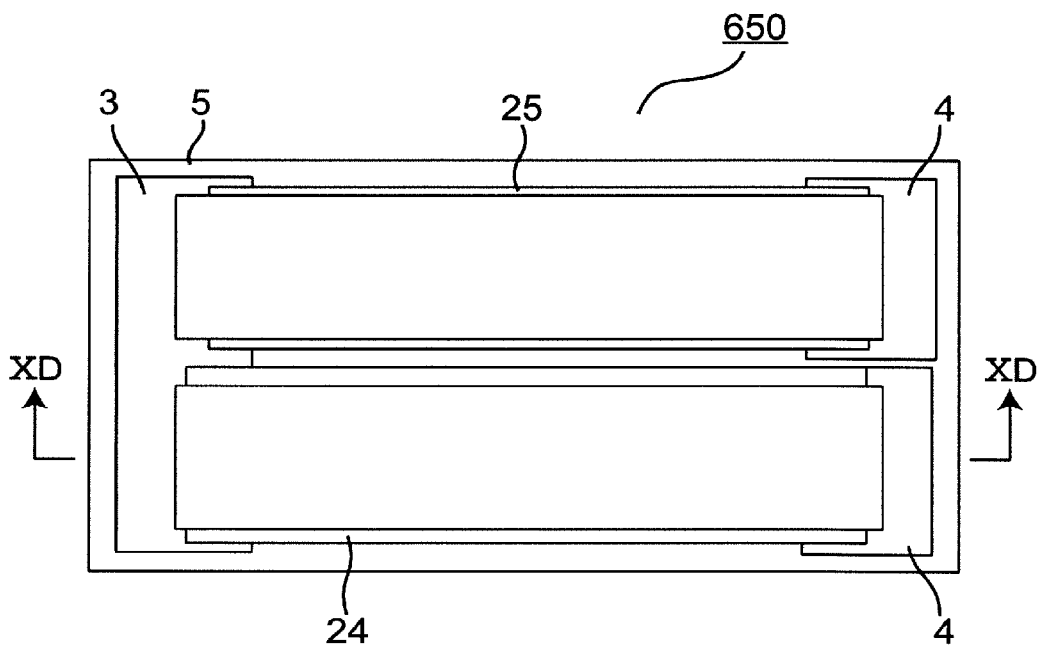
FIG. 10C is a top view of another electromagnetic wave detector according to the sixth embodiment of the present invention.
Figure 10D:
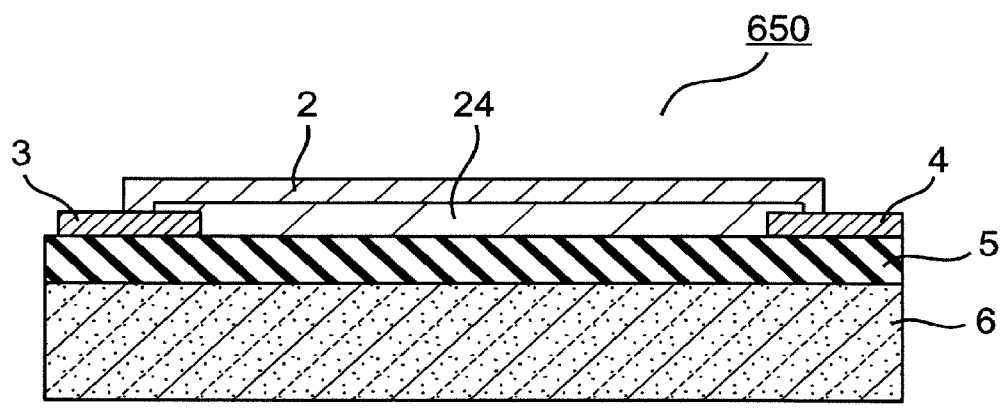
FIG. 10D is a sectional view of the electromagnetic wave detector in FIG. 10C as viewed in a XD-XD direction.

FIG. 10A is a top view of an electromagnetic wave detector according to a sixth embodiment of the present invention, generally represented by 600, and FIG. 10B is a sectional view of the electromagnetic wave detector 600 of FIG. 10A as viewed in a XB-XB direction. Further, FIG. 10C is a top view of another electromagnetic wave detector according to the sixth embodiment of the present invention, which is generally represented by 650, and FIG. 10D is a sectional view of the electromagnetic wave detector 650 of FIG. 10C as viewed in a XD-XD direction. In FIGS. 10A to 10D, the same reference symbols as in FIGS. 1A and 1B indicate the same or corresponding portions.

The electromagnetic wave detector 600 according to the sixth embodiment of the present invention differs from the electromagnetic wave detector 100 according to the first embodiment in that, as shown in FIGS. 10A and 10B, contact layers 24 and 25 are provided on both of a p-type graphene 1 and an n-type graphene 2 in the electromagnetic wave detector 600. The contact layers 24 and 25 can supply holes or electrons by contacting with the graphene. Therefore, it is possible to arbitrarily dope the graphene by the contact layers 24 and 25. In the electromagnetic wave detector 600 of FIGS. 10A and 10B, the contact layers 24 and 25 are provided on both of the p-type graphene 1 and the n-type graphene 2, but like the electromagnetic wave detector 650 of FIGS. 10C and 10D, they may be provided between a graphene and an insulating layer 5 not on the graphene but under the graphene. Alternatively, they may be provided only on or under one of the p-type graphene 1 and the n-type graphene 2.

The contact layers 24 and 25 are made of, for example, a material having a polar group, and an electron withdrawing group has an effect of reducing electron density, and an electron donating group has an effect of increasing the electron density. The electron withdrawing group includes, for example, halogen, nitrile, a carboxyl group, a carbonyl group, and the like. In addition, the electron donating group includes, for example, an alkyl group, alcohol, an amino group, a hydroxyl group, and the like. In addition to these materials, materials in which charge bias occurs in a whole molecule due to polar groups can also be applied as the material for the contact layers 24 and 25. In addition, in organic substances, metals, semiconductors, insulators, two-dimensional materials, or a mixture of any of these, materials in which polarization occurs due to charge bias in the molecule can also be applied as the material for the contact layers 24 and 25.

In general, when graphene is brought into contact with an inorganic contact layer, it is known that doping of the graphene is p-type if a work function of the contact layer is larger than a work function of the graphene and is n-type if it is smaller. However, when the contact layer is organic, it does not have a clear work function, and whether it becomes n-type dope or p-type dope to the graphene depends on polarity of a molecule used for the contact layer. For this reason, it is necessary to judge from the polar group of the material for the contact layer.

Here, film thickness of the contact layers 24 and 25 is preferably as thin as possible so that doping can be performed on graphene in such a manner that photoelectric conversion can be performed when the graphene is irradiated with an electromagnetic wave. In addition, although the contact layers 24 and 25 are described in expression of layers, they do not have to be strictly layers as long as carriers such as molecules and electrons are introduced into the graphene. For example, by immersing graphene in a solution and supplying carriers to the graphene on a molecular level, doping can be performed without forming a substantially layered contact layer. Thereby, the graphene can be doped with the electromagnetic wave to be detected without being absorbed by the contact layer.

By forming the contact layers 24 and 25 under the p-type graphene 1 or the n-type graphene 2, the input electromagnetic wave reaches the graphene without being blocked by the contact layers 24 and 25, so that a material which does not transmit an electromagnetic wave can be also used as the material for the contact layers 24, 25. For example, in a case where visible light is used as input light, even if a material which does not transmit visible light is used for the contact layers 24 and 25, the input light can reach the graphene without being attenuated.

Further, by forming (transferring) the graphene after the formation of the contact layers 24 and 25, process damage to the graphene can be suppressed. Reduction of the process damage is very effective because the graphene is easily damaged by wet process and mobility thereof is easily reduced.

For example, in a case where a composition containing a photosensitizer having a quinonediazito group and a novolak resin, which is generally called as a positive type photoresist, is formed as the contact layer 24 on the p-type graphene 1, the n-type graphene 2 in which a resist mask is not formed is doped into an n-type by a tetramethylammonium hydroxide solution to be used as a developer in a photoengraving process. Therefore, the p-type graphene 1 and the n-type graphene 2 can be obtained only by developing the resist mask. At this time, the contact layer 25 is formed of tetramethylammonium hydroxide. As a result, mask formation processing is not required, process damage can be reduced, and the process can be simplified.

When the contact layers 24 and 25 are formed of a material that causes polarity conversion, the polarity conversion of the contact layers 24 and 25 supplies electrons or holes generated during the conversion to the graphene. Thereby, doping occurs in the p-type graphene 1 and the n-type graphene 2 in contact with the contact layers 24 and 25. In this case, even if the contact layers 24 and 25 are removed, the graphene in contact with the contact layers 24 and 25 remains in the doped state, so the electromagnetic wave detector 600 can be formed in a state where the contact layers 24 and 25 are removed. Thereby, an opening area of the graphene is increased, and detection sensitivity is improved. Here, the polarity conversion is a phenomenon in which a polar group is chemically converted. For example, an electron withdrawing group is changed to an electron donating group, an electron donating group is changed to an electron withdrawing group, a polar group is changed to a nonpolar group, or a nonpolar group is changed to a polar group.

When the contact layers 24 and 25 are formed of a material that causes polarity conversion by electromagnetic wave irradiation, by selecting a material that causes polarity conversion at a detection electromagnetic wavelength, polarity conversion occurs only during photoirradiation, and a photocurrent can be increased. As a result, detection sensitivity of an electromagnetic wave is improved. In addition, the graphene can be doped similarly, in a case where oxidation/reduction reaction occurs by the electromagnetic wave irradiation and electrons or holes are generated during the reaction.

In a case where the contact layers 24 and 25 are formed of a material such as quantum dots, ferroelectrics, liquid crystals, fullerenes, or the like in which an electric field change occurs due to electromagnetic wave irradiation, an electric field generated in the graphene is changed by generating an electric field change at a detection electromagnetic wavelength. As a result, a photogate effect occurs, and a gate voltage is applied in a pseudo manner, and a photocurrent is increased to increase detection sensitivity.

By using a one-dimensional periodic structure as the contact layers 24 and 25, polarization dependence occurs when the contact layers are made of a material that generates surface plasmon resonance by electromagnetic wave irradiation. For this reason, it is possible to form an electromagnetic wave detector that detects only specific polarized light.

By using a two-dimensional periodic structure as the contact layers 24 and 25, when the contact layers are made of a material that generates surface plasmon resonance by electromagnetic wave irradiation, only an electromagnetic wave having a specific resonance wavelength can be detected strongly, and detection sensitivity of a specific wavelength can be increased.

Seventh Embodiment

In an electromagnetic wave detector (not shown) according to a seventh embodiment of the present invention, in the electromagnetic wave detector 100, a two-dimensional material such as two or more layers of graphene, transition metal dichalcogenide, or black phosphorus is used as a p-type graphene 1 and an n-type graphene 2. The other structure is the same as that of the electromagnetic wave detector 100.

The two-dimensional material such as transition metal dichalcogenide or black phosphorus is called a two-dimensional material because it has the same atomic layered structure as graphene, and is made of transition metal dichalcogenide of, for example, $MoS_2$, $WS_2$, $WSe_2$, black phosphorus, or the like. Further, among these materials, materials of the same kind or different materials may be laminated. Alternatively, different materials of probekite and graphene or a two-dimensional material may be joined.

These two-dimensional materials such as transition metal dichalcogenide material or black phosphorus has a predetermined band gap. For this reason, since an off current is almost zero, noise of the electromagnetic wave detector is reduced, and performance of the electromagnetic wave detector can be improved.

Further, in a case where the two-dimensional materials such as two or more layers of graphene, transition metal dichalcogenide or black phosphorus are laminated, size of a band gap can be adjusted by the number of layers. Therefore, a wavelength of an electromagnetic wave to be detected can be selected based on the number of layers to be laminated. Thus, it is possible to obtain a wavelength selective electromagnetic wave detector that detects only an electromagnetic wave of a specific wavelength. In particular, as in a case of an electromagnetic wave detector using a conventional semiconductor material, there is no need to control the band gap by a composition of a semiconductor material, which facilitates a manufacturing process. Moreover, since it is not necessary to use an optical filter which is typical wavelength selection means, the number of optical components can be reduced, and loss of incident light by passing through the filter can also be reduced.

In addition, in a case where the two-dimensional material such as transition metal dichalcogenide or black phosphorus is used, polarization dependence can be obtained by using a layered structure including a plurality of layers. Therefore, it is possible to realize an electromagnetic wave detector that selectively detects only specific polarized light.

Furthermore, a heterojunction is obtained by combining two or more different materials of these two-dimensional materials such as transition metal dichalcogenide and black phosphorus, or combining the two-dimensional material such as transition metal dichalcogenide or black phosphorus and graphene. By doing this, the same effect as a quantum well structure and a tunneling current in the conventional semiconductor material can be realized between the different materials. As a result, noise can be reduced and recombination can be reduced, so that detection sensitivity of the electromagnetic wave detector can be increased.

In addition, when graphene nanoribbons are used, electron density of graphene can be modulated. In this case, electrons in the graphene are coupled to an incident electromagnetic wave, and surface plasmon is excited. In a case of the graphene, a wavelength of the surface plasmon is 10 μm, which is an infrared wavelength band. Therefore, surface plasmon resonance can be used by processing the graphene into a nanoribbon shape. As a result, not only photoelectric conversion of normal graphene, but also an enhancement effect of detection sensitivity by an effect of the surface plasmon appears.

Furthermore, since the graphene nanoribbons have asymmetry in a plane with respect to the incident electromagnetic wave, they have polarization dependence in photoresponse. In a case of the graphene nanoribbons, an electromagnetic wave having 90° polarized light (an electric field of the electromagnetic wave is parallel to a Y axis) is selectively absorbed and does not respond to 0° polarized light. In other words, selective detection of polarized light is possible.

Eighth Embodiment

Figure 11A:
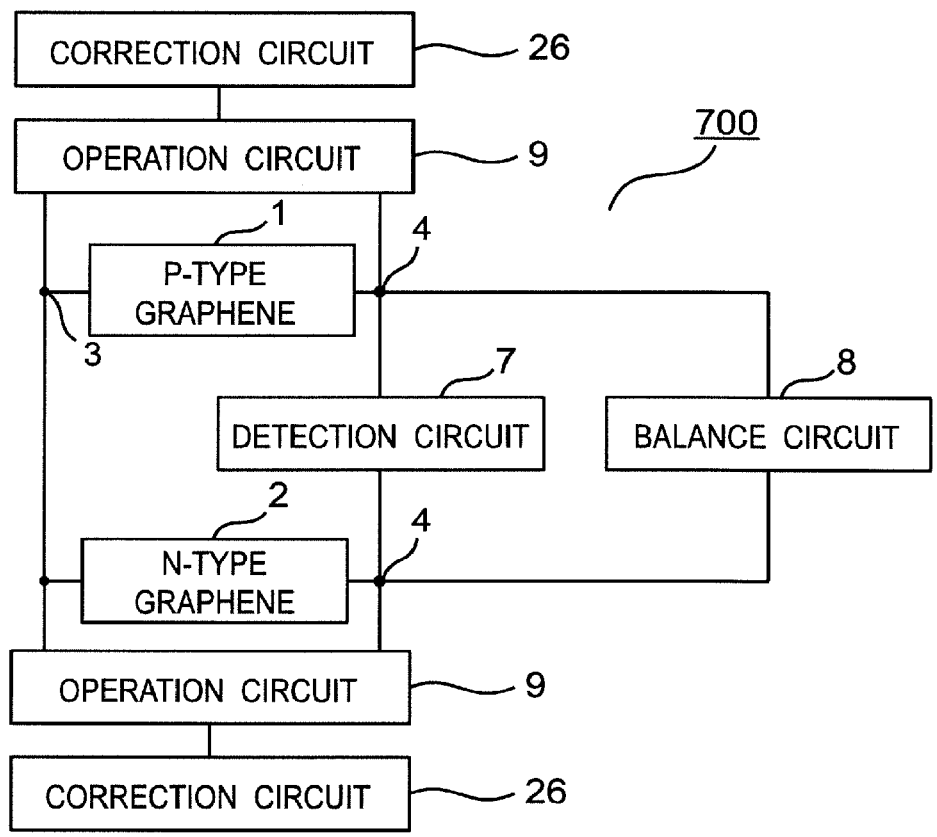
FIG. 11A is a circuit diagram of an electromagnetic wave detector according to an eighth embodiment of the present invention.

FIG. 11A is a circuit diagram of an electromagnetic wave detector according to an eighth embodiment of the present invention, generally denoted by 700. In FIG. 11A, the same reference symbols as in FIGS. 1C and 1D indicate the same or corresponding portions.

The electromagnetic wave detector 700 according to the eighth embodiment differs from the electromagnetic wave detector 100 according to the first embodiment in that, as shown in FIG. 11A, the electromagnetic wave detector 700 has correction circuits 26 each of which detects a value of a current or a voltage generated in a p-type graphene 1, an n-type graphene 2 and corrects it so that the p-type graphene 1 and the n-type graphene 2 always have the same resistance value. In response to a change with time of the currents or voltages of the p-type graphene 1 and the n-type graphene 2 operated by operation circuits 9, the correction circuits 26 detect the values of the currents or voltages generated in the p-type graphene 1 and the n-type graphene 2 and correct them as needed. A difference in the values of the currents or voltages flowing through the graphene causes an error when a time variation occurs, so that the variation can be prevented by using the correction circuits 26.

Figure 11B:
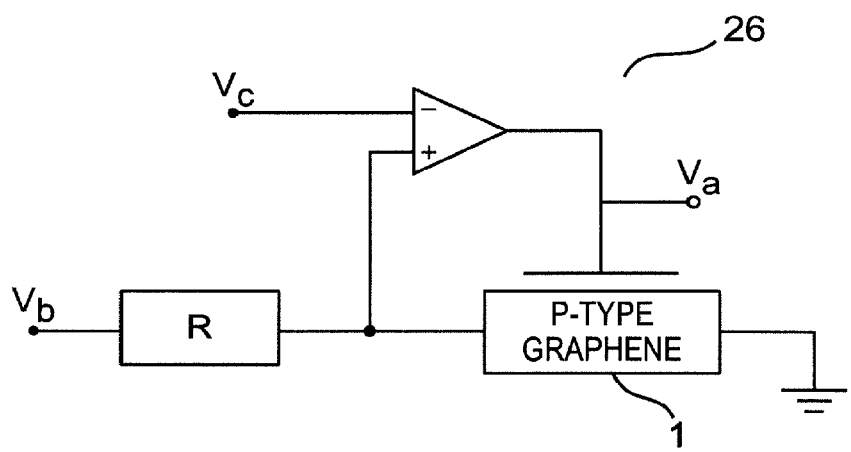
FIG. 11B is a correction circuit diagram of the electromagnetic wave detector according to the eighth embodiment of the present invention.

The correction circuit 26 may use a circuit as shown in FIG. 11B, for example. In the correction circuit 26 of FIG. 11B, by using feedback operation of an operational amplifier, a source/drain current Id flowing through the p-type graphene 1 can be determined by adjusting a resistance element R, and given by Id=(Vb−Vc)/R. At this time, as shown in FIG. 11A, the same correction circuit 26 is applied to the n-type graphene 2, and Va is common to the p-type graphene 1 and the n-type graphene 2. By generating the gate voltage Va so that Id becomes constant, it is possible to change Va according to the change with time of the current value. As described above, it is possible to prevent the change with time of the currents of the p-type graphene 1 and the n-type graphene 2 by utilizing a mechanism for feeding back and correcting an output that is desired to be constant using the operational amplifier or the like. If it is desired to make the voltage constant, the voltage may be fed back similarly to control the current value. Note that the correction circuit 26 is not limited to the circuit shown in FIG. 11B, and any circuit may be used as long as it is a circuit that detects a current or a voltage and corrects it as needed.

Ninth Embodiment

Figure 12A:
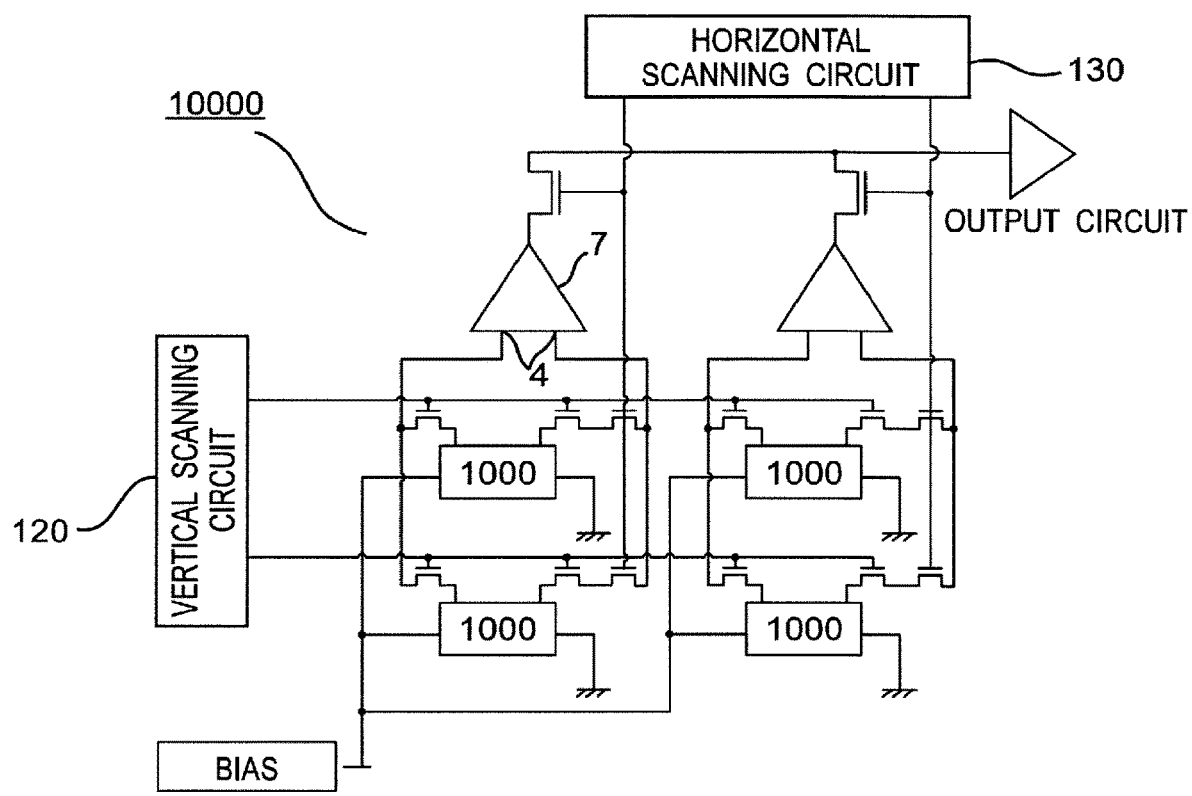
FIG. 12A is a circuit diagram of an electromagnetic wave detector array according to a ninth embodiment of the present invention.

FIG. 12A shows an electromagnetic wave detector array according to a ninth embodiment of the present invention, which is generally represented as 10000. The electromagnetic wave detector array 10000 has pixels 1000 arranged in 2×2, but the number of pixels to be arranged is not limited to this.

Figure 12B:
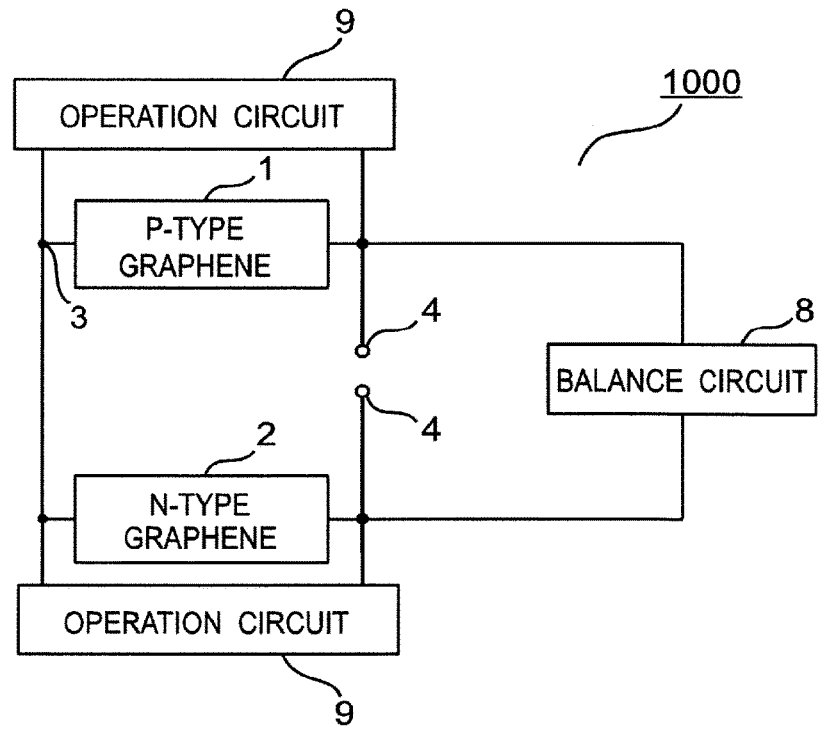
FIG. 12B is a circuit diagram of an electromagnetic wave detector according to the ninth embodiment of the present invention.
Figure 12C:
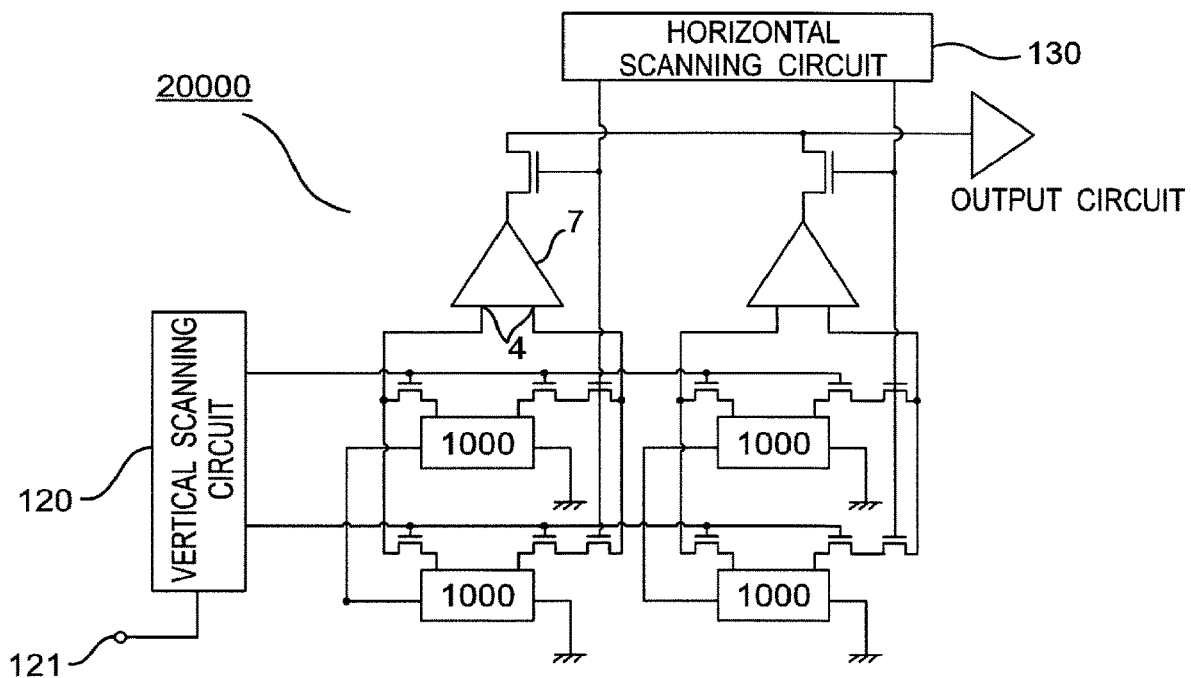
FIG. 12C is a circuit diagram of another electromagnetic wave detector array according to the ninth embodiment of the present invention.

As shown in FIG. 12A, the electromagnetic wave detector array 10000 may detect a signal from each pixel 1000 using a vertical scanning circuit 120 and a horizontal scanning circuit 130. At this time, as shown in FIG. 12B, with a space between terminals of electrodes 4 as an output, a detection circuit 7 is formed of an operational amplifier and disposed for each column. As a result, it becomes unnecessary to provide the detection circuit 7 in the pixel 1000, and size of each pixel 1000 can be reduced. In addition, by disposing other circuits such as a balance circuit and an operation circuit outside the pixel 1000, the size of each pixel 1000 can be further reduced, and a sensor can be miniaturized. Further, as in an electromagnetic wave detector array 20000 shown in FIG. 12C, a circuit 121 for applying a bias voltage Vd may be incorporated in a vertical scanning circuit 120.

Operation of the electromagnetic wave detector array 10000 first makes a dark state difference zero by balancing each single pixel.

Next, a voltage is applied to the vertical scanning circuit 120 to select one row.

Further, a voltage is applied to the horizontal scanning circuit 130 to select one column. Thus, a signal of one pixel 1000 is read out.

By fixing the voltage of the vertical scanning circuit 120 and sequentially applying the voltage to the horizontal scanning circuit 130, all the signals from the pixels 1000 in one row are read out.

Next, the vertical scanning circuit 120 is switched to select another row.

In this state, the horizontal scanning circuit 130 is similarly operated to sequentially read out the signal for each pixel. By repeating this, responses of all the pixels can be read out.

In the ninth embodiment of the present invention, the method of reading out a signal for each pixel using the vertical scanning circuit 120 and the horizontal scanning circuit 130 has been described. However, a column may be first selected by the horizontal scanning circuit 130, and a signal of each pixel may be read out for each column using the vertical scanning circuit 120. In addition, other methods may be used to read out the signal of each pixel.

Further, a timing for balancing the pixel 1000 may be before scanning or may be included in operation during the scanning. Balancing the pixel 1000 before the scanning shortens a scanning time and improves a response speed. On the other hand, balancing during the scanning eliminates a possibility of imbalance over time.

The electromagnetic wave detector array 10000 using graphene can detect electromagnetic waves in a very wide wavelength band from ultraviolet light to microwaves. Therefore, for example, when the electromagnetic wave detector array 10000 is applied to an on-vehicle sensor, it can be used as a camera for visible light image in the daytime, and can also be used as an infrared camera at night, so that it is not necessary to use different cameras depending on a detection wavelength.

Tenth Embodiment

Figure 13A:
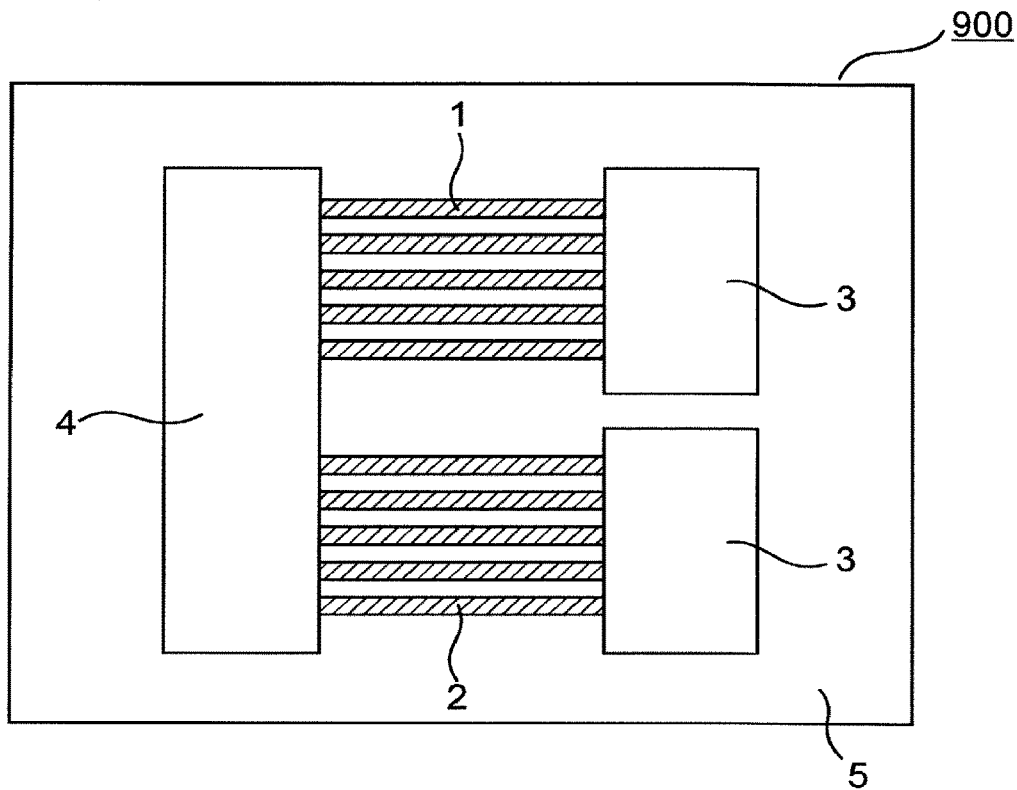
FIG. 13A is a top view of one pixel of an electromagnetic wave detector according to a tenth embodiment of the present invention.

FIG. 13A is a top view of an electromagnetic wave detector according to a tenth embodiment of the present invention, generally indicated by 900. In FIG. 13A, the same reference symbols as in FIGS. 1A and 1B indicate the same or corresponding portions.

As shown in FIG. 13A, in the electromagnetic wave detector 900, a p-type graphene 1 and an n-type graphene 2 are processed into a nanoribbon shape, and the other structure is the same as that of the electromagnetic wave detector 100. Note that in order to simplify the description, description of circuits other than pixels, for example, an operation circuit and a detection circuit, which are included in the electromagnetic wave detector 900, is omitted.

Figure 13B:
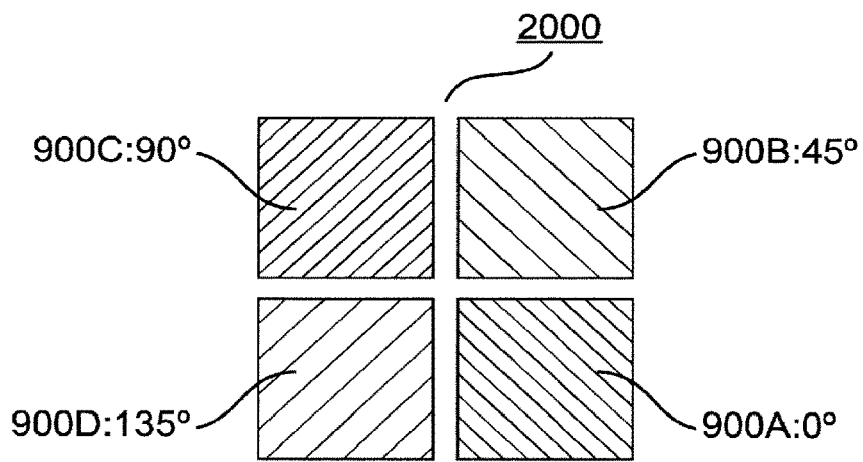
FIG. 13B is a configuration diagram of an electromagnetic wave detector array according to the tenth embodiment of the present invention.
Figure 13B:
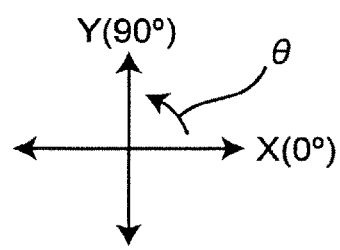

FIG. 13B is a schematic diagram of one unit of an electromagnetic wave detector array, generally represented by 2000, in which pixels 900A to 900D each provided with the nanoribbon-like p-type graphene 1 and n-type graphene 2 are arranged in 2×2. Coordinates shown in a lower part of FIG. 13B are coordinates for defining a direction in which nanoribbon-shaped graphene is disposed. A longitudinal direction (left and right direction in FIG. 13A) of the nanoribbon in case of an X axis direction is 0°, and a direction of the nanoribbon is indicated by a counterclockwise angle θ. For example, θ is 90° in a direction parallel to a Y axis.

As shown in FIG. 13A, the longitudinal directions of the nanoribbon-shaped graphene of the pixels 900A, 900B, 900C, and 900D are directions of 0°, 45°, 90°, and 135°, respectively. Here, in the pixel 900A in which θ is 0°, a dimension (width) in a Y direction of the nanoribbon is about 100 μm at most. As described above, by making the graphene into the nanoribbon shape, electron density of the graphene is modulated, and selective detection of polarized light becomes possible.

Next, polarization imaging using one unit 2000 of the electromagnetic wave detector array according to the tenth embodiment will be described. Here, as shown in FIG. 13B, the polarization imaging is a technique in which, in the unit 2000 having four pixels 900A, 900B, 900C, 900D with θ of 0°, 45°, 90°, 135° different from one another, an image is taken for each of four polarization angles, and a difference is determined to reflect a relative polarization distribution on the image.

In order to obtain a polarization imaging image, first, differences in sensor output among the pixels 900A, 900B, 900C, and 900D are obtained. The difference is obtained between basic vectors. For example, in a case of the pixel 900A in which θ is 0°, a difference between the pixel 900A and the pixel 900C in which θ is 90° is obtained, and in a case of the pixel 900B in which θ is 45°, a difference between the pixel 900B and the pixel 900D in which θ is 135° is obtained. These differences are called Stokes parameters. Also, instead of the difference, DoLP (Degree of Linear Polarization) may be calculated from each Stokes parameter.

In order to realize the polarization imaging, four pixels 900A, 900B, 900C, and 900D with θ of 0°, 45°, 90°, and 135° are used as one unit 2000. By arraying the unit 2000, an image sensor is formed. Also, instead of four pixels, even when a pair of two pixels having θ of 0° and 90° (900A, 900C) or a pair of two pixels having θ of 45° and 135° (900B, 900D) are formed as one unit, the polarization imaging can be realized.

Thus, to realize the polarization imaging with the graphene nanoribbons, as shown in FIG. 13B, the nanoribbons may be disposed such that θ is 0°, 45°, 90°, and 135° to form the pixel unit 2000. In the electromagnetic wave detector array using such a pixel unit 2000, polarization imaging can be performed by the graphene in a wide band such as an ultraviolet region to a radio wave region. In particular, as in the case of the electromagnetic wave detector 100 according to the first embodiment, a dark current can be reduced to zero by using a pn differential structure using the p-type graphene 1 and the n-type graphene 2, so that highly accurate polarization imaging can be realized.

Eleventh Embodiment

Figure 13C:
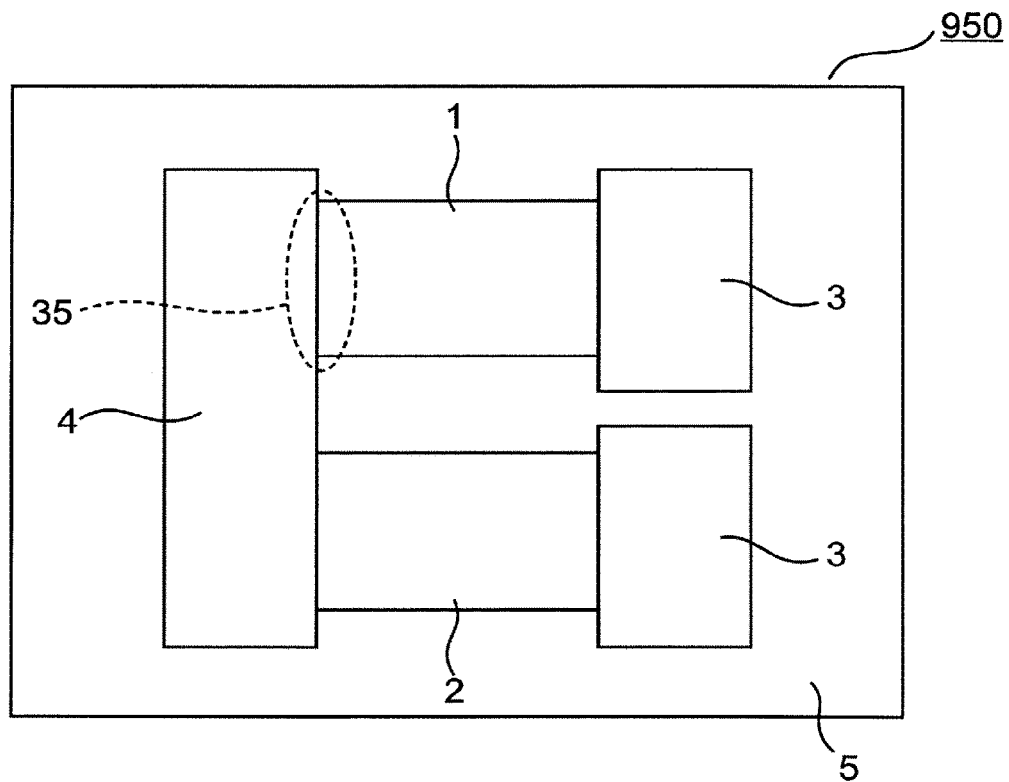
FIG. 13C is a top view of one pixel of another electromagnetic wave detector according to an eleventh embodiment of the present invention.

FIG. 13C is a top view of an electromagnetic wave detector according to an eleventh embodiment of the present invention, which is generally denoted by 950. In FIG. 13C, the same reference symbols as in FIGS. 1A and 1B indicate the same or corresponding portions.

Note that, in the eleventh embodiment, for simplification of the description, it is assumed that one pixel is represented by a set of a p-type graphene 1 and an n-type graphene 2 and that other circuits such as an operation circuit are incorporated in one pixel.

When graphene is used for a photodetector, a region contributing to photoelectric conversion is known to be dominated by an interface between the graphene and an electrode, which is denoted by 35 in FIG. 13C. Also, in FIG. 13C, a direction of the interface, that is, a direction of ends of electrodes 3 and 4 in portions where the electrodes 3 and 4 intersect with the p-type graphene 1 and the n-type graphene 2, is a 90° direction (up and down direction) of the coordinates in FIG. 13B.

In an electromagnetic wave detector such as a graphene transistor, for example, silicon oxide ($SiO_2$), aluminum oxide ($Al_2O_3$), silicon nitride (SiN), hafnium oxide ($HfO_2$), or boron nitride (BN) is used for an insulating layer 5 under the p-type graphene 1 and the n-type graphene 2. These insulating materials absorb an electromagnetic wave in the vicinity of 10 μm, which is an infrared wavelength band, and generate heat by this absorption. This heat generation causes graphene in a channel to form a thermal gradient depending on a distance from the electrode. When heat distribution occurs in the graphene, as in a case of a thermocouple, a thermopower effect occurs, and an electromagnetic wave response is obtained.

Furthermore, in the absorption of the electromagnetic wave, an electric field perpendicular to the direction of the interface 35 (in FIG. 13C, an electromagnetic wave having polarized light having an electric field in a 0° direction) is selectively absorbed. In other words, as described in the tenth embodiment, in the infrared wavelength band, the graphene transistor has polarization dependence. Therefore, polarization imaging similar to that of the tenth embodiment can be realized by arranging four pixels whose direction of the interface 35 is 0°, 45°, 90°, and 135° as one unit.

By using a therraoelectromotive effect of the graphene and the polarization dependence of absorption of the insulating layer 5 at the interface 35, polarization detection can be selectively performed in the infrared wavelength band. Graphene has high response speed, so high-performance polarization imaging can be realized. Further, since the present effect is centered on the wavelength band near 10 μm, it is possible to selectively detect polarization of only a thermal infrared wavelength without using a special wavelength selection filter or a polarizer.

Note that the absorption wavelength can be changed to a wavelength different from the absorption wavelength of the material itself by providing a recess/protrusion in the insulating layer 5 or forming a multilayer film of graphene. Thereby, the wavelength band in which polarization imaging is effective can be changed to a wavelength band other than the infrared wavelength. A recess/protrusion structure includes one-dimensional or two-dimensional periodic recesses or protrusions, such as a photonic crystal. A shape of the recess or the protrusion includes a circle, a square, a rectangle, other polygons, or any fractal structure. Moreover, by using a nitride producing plasmon resonance like TiN as a material of the insulating layer 5, it is also possible to produce an absorption effect in visible light and near infrared light.

Twelfth Embodiment

Figure 14:
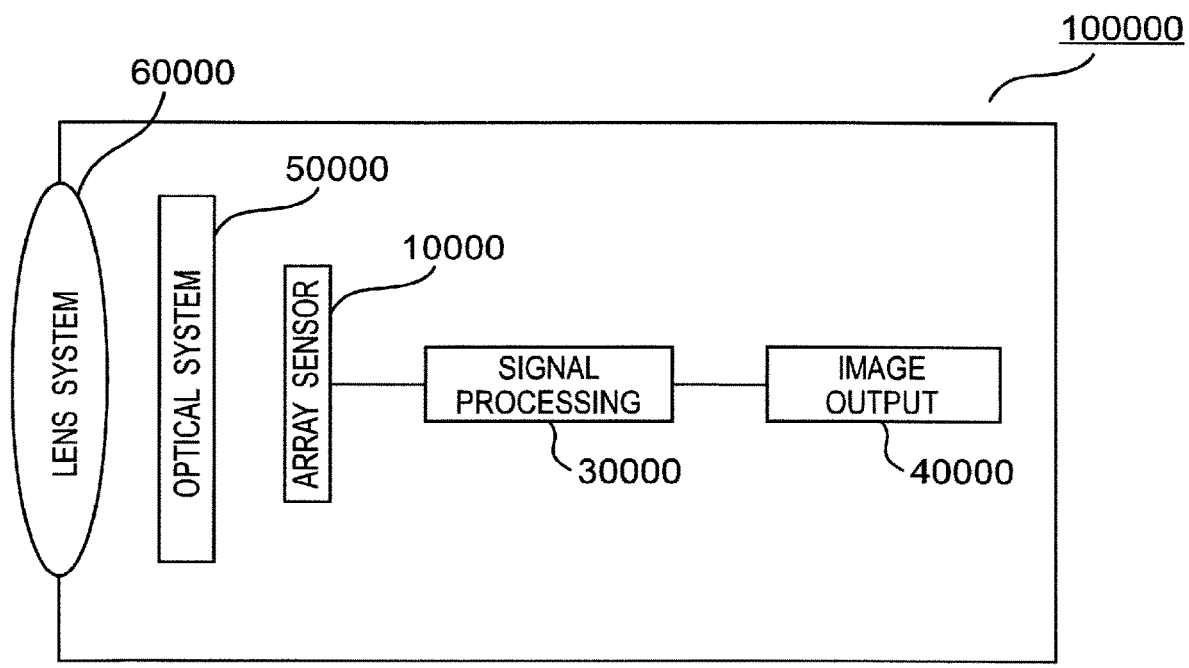
FIG. 14 is a conceptual diagram of a camera system according to a twelfth embodiment of the present invention.

FIG. 14 is a schematic view of a camera system according to a twelfth embodiment of the present invention, which is generally represented by 100000. The camera system 100000 includes an electromagnetic wave detector array 10000 or an electromagnetic wave detector array 20000. A signal processing system 30000 and an image output device 40000 are connected to the electromagnetic wave detector array 10000 or 20000. The camera system 100000 also includes a lens system 60000 and an optical system 50000 such as a shutter, an aperture, and a filter.

In the camera system 100000, an input electromagnetic wave is collected by the lens system 60000 and input to the electromagnetic wave detector array 10000 via the optical system 50000. An output signal obtained from the electromagnetic wave detector array 10000 is processed by the signal processing system 30000 and output as an image from the image output system 40000. The lens system 60000 may switch between a visible lens, a near infrared lens, an infrared lens, a terahertz lens, and the like as needed. By switching the lenses, light of various wavelengths can be input to the electromagnetic wave detector array 10000 without a filter. At this time, the shutter, the aperture, the filter, or the like may or may not be used as the optical system 50000 as necessary. Further, when the lens system 60000 is not used or when an ultra-wide band lens is used as the lens system 60000, it is possible to detect with the electromagnetic wave detector array of all wavelength bands.

Also, a metamaterial lens may be used for the lens system 60000. A metamaterial lens is a lens in which transmission of light as well as a focal distance can be adjusted in a structure by providing a periodic structure (including a pseudo periodic structure in which an arranged structure is different) on a surface. A wavelength to be transmitted can be selectively controlled by controlling the structure without depending on a material to be transmitted. In addition, it is possible to realize an ultra-wide band lens that can condense light of all wavelengths at the same focal distance.

Thirteenth Embodiment

Figure 15A:
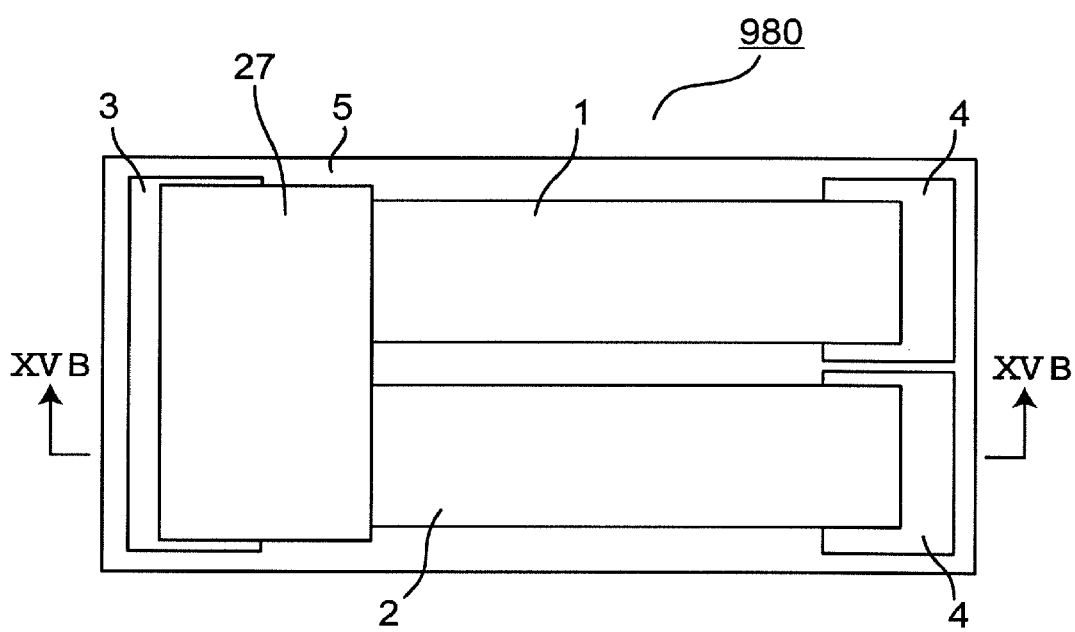
FIG. 15A is a top view of an electromagnetic wave detector according to a thirteenth embodiment of the present invention.
Figure 15B:
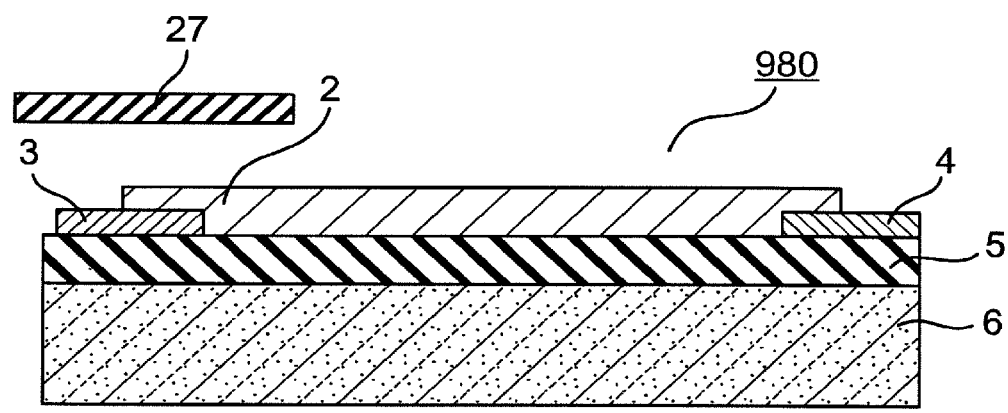
FIG. 15B is a sectional view of the electromagnetic wave detector in FIG. 15A as viewed in a XVB-XVB direction.
Figure 8C:
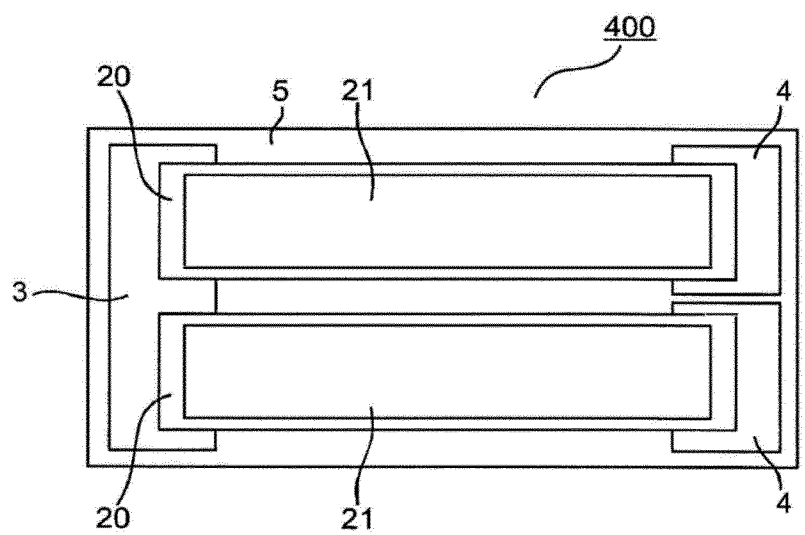
Figure 13A:
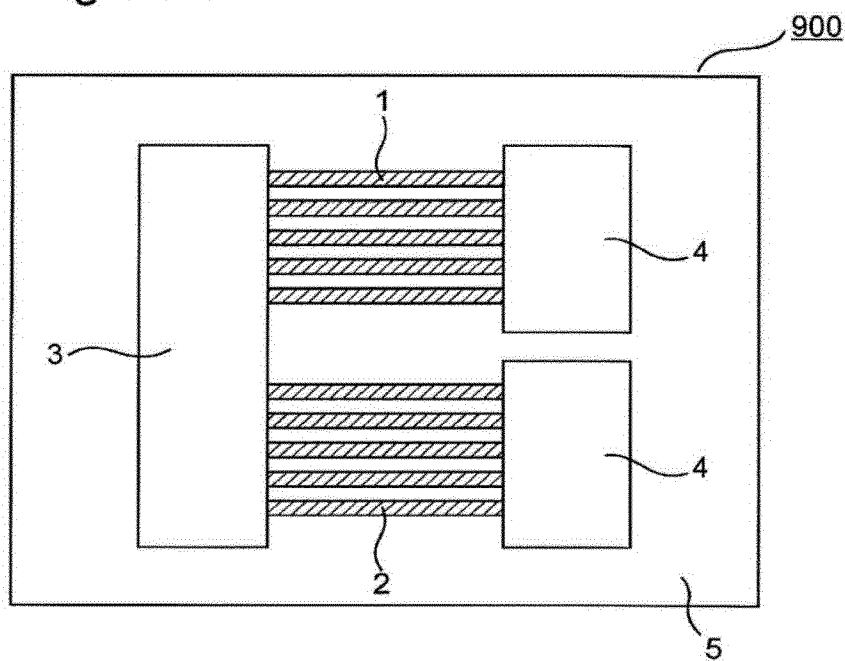

FIG. 15A is a top view of an electromagnetic wave detector according to a thirteenth embodiment of the present invention, generally represented by 980, and FIG. 15B is a sectional view of the electromagnetic wave detector 980 in FIG. 15A as viewed in a XVB-XVB direction. The electromagnetic wave detector 980 according to the thirteenth embodiment of the present invention differs from the electromagnetic wave detector 100 according to the first embodiment in that, as shown in FIGS. 15A and 15B, a light shielding portion 27 is provided in an optical path of an electromagnetic wave incident on either one of interfaces between graphenes 1, 2 and an electrode 3 or 4.

Generally, in a graphene transistor, photoelectric conversion of graphene has the largest contribution to an interface region between an electrode and the graphene, and the interface between the graphene and the electrode is irradiated with an electromagnetic wave, whereby electron-hole pairs are efficiently formed. Since a common graphene transistor has a symmetrical structure, a photocurrent due to electron-hole pairs generated at an interface between a source electrode/a drain electrode and graphene is canceled and attenuated between a source and a drain. Therefore, by shielding the interface between either one of the source electrode and the drain electrode and the graphene, a left-right asymmetric structure is obtained, and the photocurrent can be increased.

Therefore, in the electromagnetic wave detector 980 according to the thirteenth embodiment of the present invention, as shown in FIG. 15A, the light shielding portion 27 is provided so that the graphenes 1 and 2 are left-right asymmetric. Accordingly, currents flow through the p-type graphene 1 and the n-type graphene 2 in opposite directions, and photocurrents can be amplified. In FIGS. 15A and 15B, the light shielding portion 27 is provided at the interface between the electrode 3 and the graphenes 1, 2. However, the light shielding portion 27 may be provided at the interface between the electrode 4 and the graphenes 1, 2.

Moreover, as long as the photocurrents are generated in the graphemes 1 and 2 in the opposite directions, doping levels of the two graphenes 1 and 2 may be the same. Note that, FIGS. 15A and 15B are one example, and a position where the light shielding portion 27 is provided varies depending on doping levels of the graphenes 1 and 2 and positive and negative of a Dirac point shifted by a wavelength of an incident electromagnetic wave. Accordingly, the light shielding portion 27 may be provided so that the photocurrent is appropriately increased.

With respect to a source/drain current in each graphene transistor, the light shielding portion may be provided so as to increase the photocurrent positively when the photocurrent is increased positively by electromagnetic wave irradiation, and may be provided so as to increase the photocurrent negatively when the photocurrent is increased negatively. In this case, photocurrents in opposite directions may be generated in the graphene 1 and the graphene 2. When only one graphene is used, the light shielding portion 27 may simply be provided so as to increase the photocurrent. In addition, since a light shielding range of the light shielding portion 27 varies depending on size and a shape of a graphene channel, the light shielding portion may be provided such that the photocurrent generated due to the asymmetry of the graphene transistor is increased most. For example, a shape that shields a portion other than the interface between one of the electrodes and the graphene may be used.

DESCRIPTION OF REFERENCE SYMBOLS

1 P-TYPE GRAPHENE
2 N-TYPE GRAPHENE
3,4 ELECTRODE
5 INSULATING LAYER
6 SUBSTRATE
7 DETECTION CIRCUIT
8 BALANCE CIRCUIT
9 OPERATION CIRCUIT
10 DIFFERENTIAL AMPLIFIER CIRCUIT
100 ELECTROMAGNETIC WAVE DETECTOR

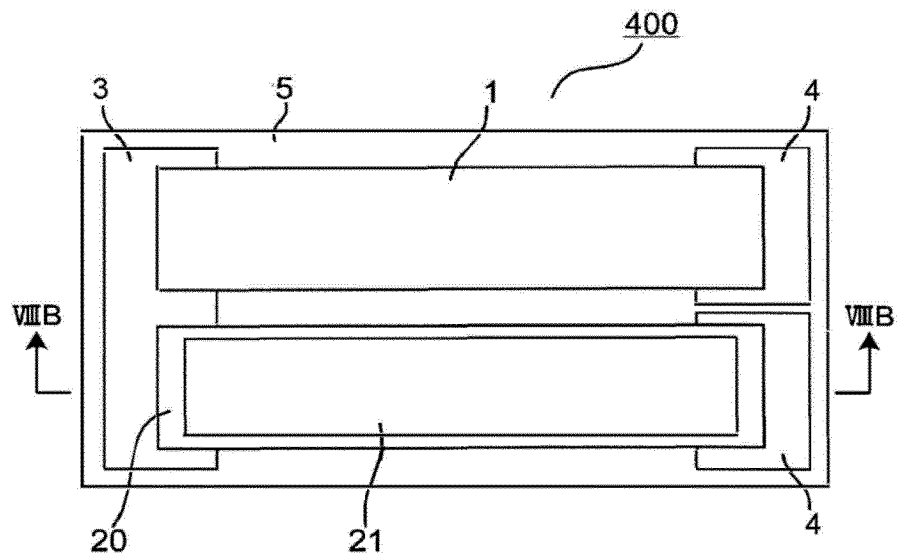

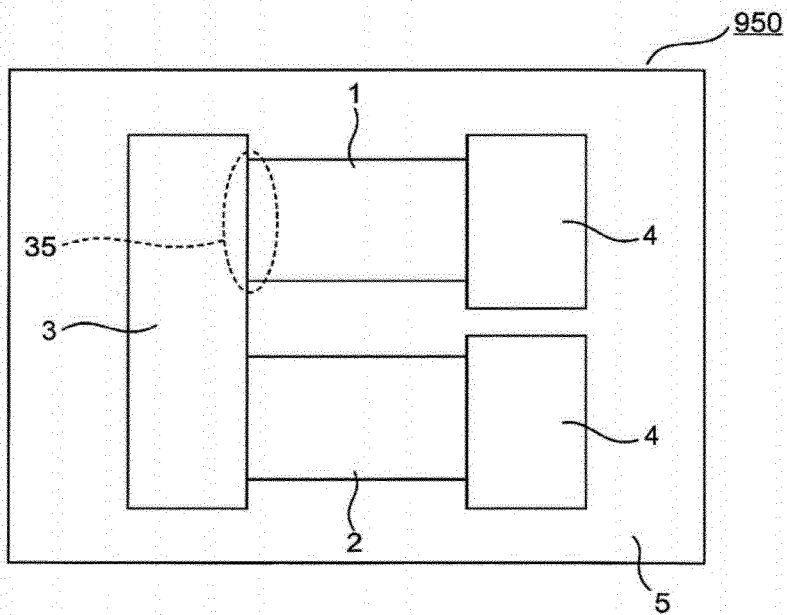

The invention claimed is:

1. An electromagnetic wave detector for converting an electromagnetic wave into an electric signal and detecting the electric signal, comprising:
   a substrate; and
   an insulating layer provided on the substrate, and
   further comprising the following (a) or (b):
   (a) p-type and n-type graphenes juxtaposed on the insulating layer;
   a first electrode and a second electrode disposed facing each other with the p-type and n-type graphenes interposed,
      the first electrode being one electrode electrically connected to both the p-type and n-type graphenes at one ends,
      the second electrode being two electrodes electrically connected to other ends of the p-type and n-type graphenes, respectively;
   a gate electrode that applies an operation voltage to the p-type and n-type graphenes;
   a balance circuit connected between the two second electrodes; and
   a detection circuit that detects electric signals between the two second electrodes,
   wherein the p-type graphene has a Dirac point voltage higher than the operation voltage, and the n-type graphene has a Dirac point voltage lower than the operation voltage,
   in a state in which an electromagnetic wave is not incident on the p-type and n-type graphenes, the balance circuit makes the first electrode and the second electrode have an identical potential,
   in a state in which the electromagnetic wave is incident on the p-type and n-type graphenes, the detection circuit detects electric signals between the second electrodes, and
   the electric signals in the state in which the electromagnetic wave is incident are output,
   (b) a graphene provided on the insulating layer;
   a first electrode and a second electrode disposed facing each other with the graphene interposed, the first electrode electrically connected to one end of the graphene, and the second electrode electrically connected to another end of the graphene;
   a gate electrode that applies a gate voltage to the graphene, the graphene becoming hole conductive when the gate voltage is $V_{OP1}$ and electron conductive when the gate voltage is $V_{OP2}$; and
   a detection circuit that detects electric signals between the first electrode and the second electrode,
   wherein in a state in which an electromagnetic wave is not incident on the graphene, electric signals when the gate voltage is $V_{OP1}$ and $V_{OP2}$ are detected,
   in a state in which the electromagnetic wave is incident on the graphene, electric signals when the gate voltage is $V_{OP1}$ and $V_{OP2}$ are detected, and
   a difference in the electric signals when the gate voltage is $V_{OP1}$ and a difference in the electric signals when the gate voltage is $V_{OP2}$ between the state in which the electromagnetic wave is incident and the state in which the electromagnetic wave is not incident are obtained respectively, and a sum of these two differences are obtained and output.

2. The electromagnetic wave detector according to claim 1, further comprising: a memory circuit that stores an output when the electromagnetic wave is not incident,
wherein when the electromagnetic wave is irradiated, a difference between a value stored in the memory circuit and the detected electric signal is output.

3. The electromagnetic wave detector according to claim 1, wherein the balance circuit is a bridge circuit in which the p-type and n-type graphenes and two or more resistance elements are combined or a bridge circuit in which either one of the p-type and n-type graphenes and three or more resistance elements are combined.

4. The electromagnetic wave detector according to claim 3, wherein the resistance element is configured by one or more elements selected from a group consisting of a semiconductor thin film transistor element, a thin film resistance element, a two-dimensional material transistor element, a transistor element using the p-type graphene, and a transistor element using the n-type graphene.

5. The electromagnetic wave detector according to claim 1, wherein a differential amplifier circuit is used as the detection circuit, and a differential current at a time of electromagnetic wave irradiation output from the first electrode electrically connecting the p-type and n-type graphenes in series is used as an input of the differential amplifier circuit.

6. The electromagnetic wave detector according to claim 1, wherein the gate electrode is provided on an insulating layer provided on the graphene or provided under an insulating layer provided under the graphene, and a voltage is applied to the graphene from the gate electrode.

7. The electromagnetic wave detector according to claim 1, further comprising: a contact layer provided in contact with the graphene on or under the graphene, wherein the contact layer supplies holes or electrons to the graphene.

8. The electromagnetic wave detector according to claim 7, wherein the contact layer is made of a material that causes an electric field change due to electromagnetic wave irradiation.

9. The electromagnetic wave detector according to claim 7, wherein the contact layer is selected from a group consisting of quantum dots, ferroelectric materials, fullerenes, liquid crystal materials, and plasmon antennas.

10. The electromagnetic wave detector according to claim 1, wherein the graphene is selected from a group consisting of one-layer graphene, two or more layers of laminated graphene, graphene nanoribbons, and a two-dimensional material having one-layer or a laminated structure.

11. The electromagnetic wave detector according to claim 1, further comprising: a correction circuit that detects current values or voltage values of the p-type and n-type graphenes when the electromagnetic wave is not incident, and corrects the values as needed so that the p-type and n-type graphenes have an identical resistance value.

12. The electromagnetic wave detector according to claim 1, wherein a light shielding portion is provided in an optical path of the electromagnetic wave incident on either one of interfaces between the graphene and the first electrode or the second electrode.

13. An electromagnetic wave detector array in which the electromagnetic wave detector according to claim 1 is set as one pixel, and the pixels are arranged in an array shape.

14. The electromagnetic wave detector array according to claim 13, wherein four electromagnetic wave detectors having different longitudinal directions of the graphene by 45° each are set as pixels and arranged in an array shape.

15. An electromagnetic wave detection method, in which a p-type transistor having a channel of a p-type graphene having a Dirac point voltage at a gate voltage higher than an operation gate voltage, and an n-type transistor having a channel of an n-type graphene having a Dirac point voltage at a gate voltage lower than the operation gate voltage are connected in series, and electric signals at both ends thereof are detected, comprising:
applying the operation gate voltage to the p-type transistor and the n-type transistor in a state in which an electromagnetic wave is not incident on the p-type graphene and the n-type graphene, and controlling a resistance value of the channel of the p-type graphene and a resistance value of the channel of the n-type graphene so as to become identical;
detecting the electric signals in the state in which the electromagnetic wave is not incident on the p-type graphene and the n-type graphene;
detecting the electric signals in a state in which the electromagnetic wave is incident on the p-type graphene and the n-type graphene; and
obtaining and outputting a difference in the electric signals between the state in which the electromagnetic wave is incident and the state in which the electromagnetic wave is not incident.

16. An electromagnetic wave detection method for detecting electric signals at both ends of a transistor having a channel of graphene, in which the graphene becomes hole conductive when a gate voltage of the transistor is $V_{OP1}$ and becomes electron conductive when the gate voltage is $V_{OP2}$, comprising:
detecting the electric signals when the gate voltage is $V_{OP1}$ and $V_{OP2}$ in a state in which an electromagnetic wave is not incident on the graphene;
detecting the electric signals when the gate voltage is $V_{OP1}$ and $V_{OP2}$ in a state in which the electromagnetic wave is incident on the graphene; and
obtaining a difference in the electric signals when the gate voltage is $V_{OP1}$ and a difference in the electric signals when the gate voltage is $V_{OP2}$ between the state in which the electromagnetic wave is incident and the state in which the electromagnetic wave is not incident, respectively, and obtaining and outputting a sum of these two differences.

17. The electromagnetic wave detection method according to claim 15, wherein the electric signal is a current or a voltage.

18. The electromagnetic wave detection method according to claim 16, wherein the electric signal is a current or a voltage.

* * * * *

UNITED STATES PATENT AND TRADEMARK OFFICE
CERTIFICATE OF CORRECTION

PATENT NO.         : 10,957,810 B2
APPLICATION NO.    : 16/475432
DATED              : March 23, 2021
INVENTOR(S)        : Masaaki Shimatani et al.

It is certified that error appears in the above-identified patent and that said Letters Patent is hereby corrected as shown below:

In the Drawings

Sheet 9, Fig. 8A should appear as shown on the attached sheet

Sheet 10, Fig. 8C should appear as shown on the attached sheet

Sheet 17, Fig. 13A should appear as shown on the attached sheet

Sheet 18, Fig. 13C should appear as shown on the attached sheet

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*